US009854668B2

(12) United States Patent
Sano et al.

(10) Patent No.: US 9,854,668 B2
(45) Date of Patent: Dec. 26, 2017

(54) DISPLAY DEVICE

(71) Applicant: Japan Display Inc., Minato-ku (JP)

(72) Inventors: Takumi Sano, Tokyo (JP); Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/452,022

(22) Filed: Mar. 7, 2017

(65) Prior Publication Data

US 2017/0257939 A1    Sep. 7, 2017

(30) Foreign Application Priority Data

Mar. 7, 2016   (JP) ................................. 2016-043412
Nov. 10, 2016  (JP) ................................. 2016-219590

(51) Int. Cl.
  *H01J 1/62*   (2006.01)
  *H05K 1/02*   (2006.01)
  *H05K 1/11*   (2006.01)

(52) U.S. Cl.
  CPC ............. *H05K 1/028* (2013.01); *H05K 1/111* (2013.01)

(58) Field of Classification Search
  CPC .................................. H05K 1/028; H05K 1/111

USPC ......................................... 313/512, 498, 506
See application file for complete search history.

(56) References Cited

U.S. PATENT DOCUMENTS

2014/0361183 A1    12/2014   Takeda et al.

FOREIGN PATENT DOCUMENTS

| JP | 10-104651 | 4/1998 |
| JP | 10-189863 | 7/1998 |
| JP | 2009-237410 | 10/2009 |
| JP | 2014-236209 | 12/2014 |

*Primary Examiner* — Vip Patel
(74) *Attorney, Agent, or Firm* — Oblon, McClelland, Maier & Neustadt, L.L.P.

(57) ABSTRACT

According to one embodiment, a display device includes a first flexible substrate including an insulating substrate with a first area, a second area adjacent to the first area, and a through hole, and a pad electrode, a second flexible substrate including a connection line, the second flexible substrate disposed below the first flexible substrate, and an anisotropy conductive film which electrically connects the pad electrode and the connection line, wherein the anisotropy conductive film is disposed between the second area and the second flexible substrate, and has a first film thickness in a first position and a second film thickness in a second position, where the first film thickness is greater than the second film thickness.

17 Claims, 15 Drawing Sheets

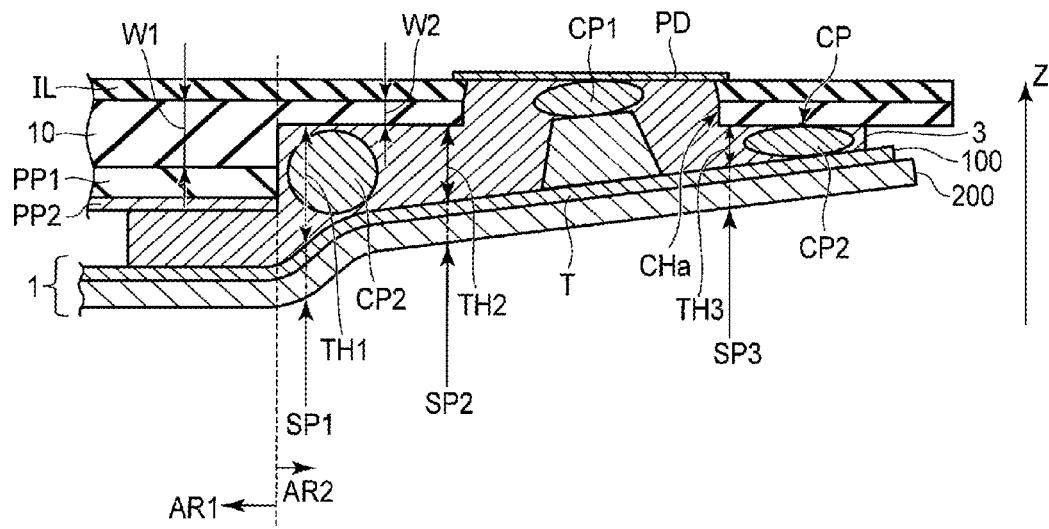
F I G. 4
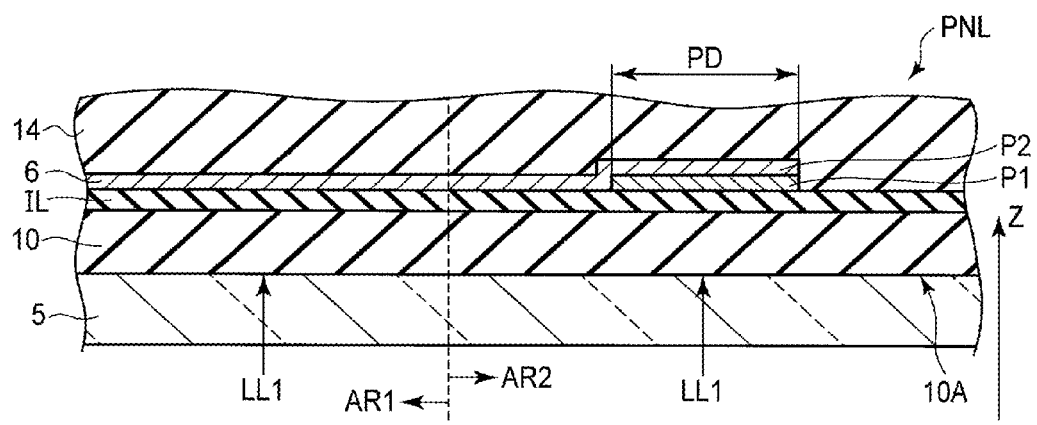
F I G. 5

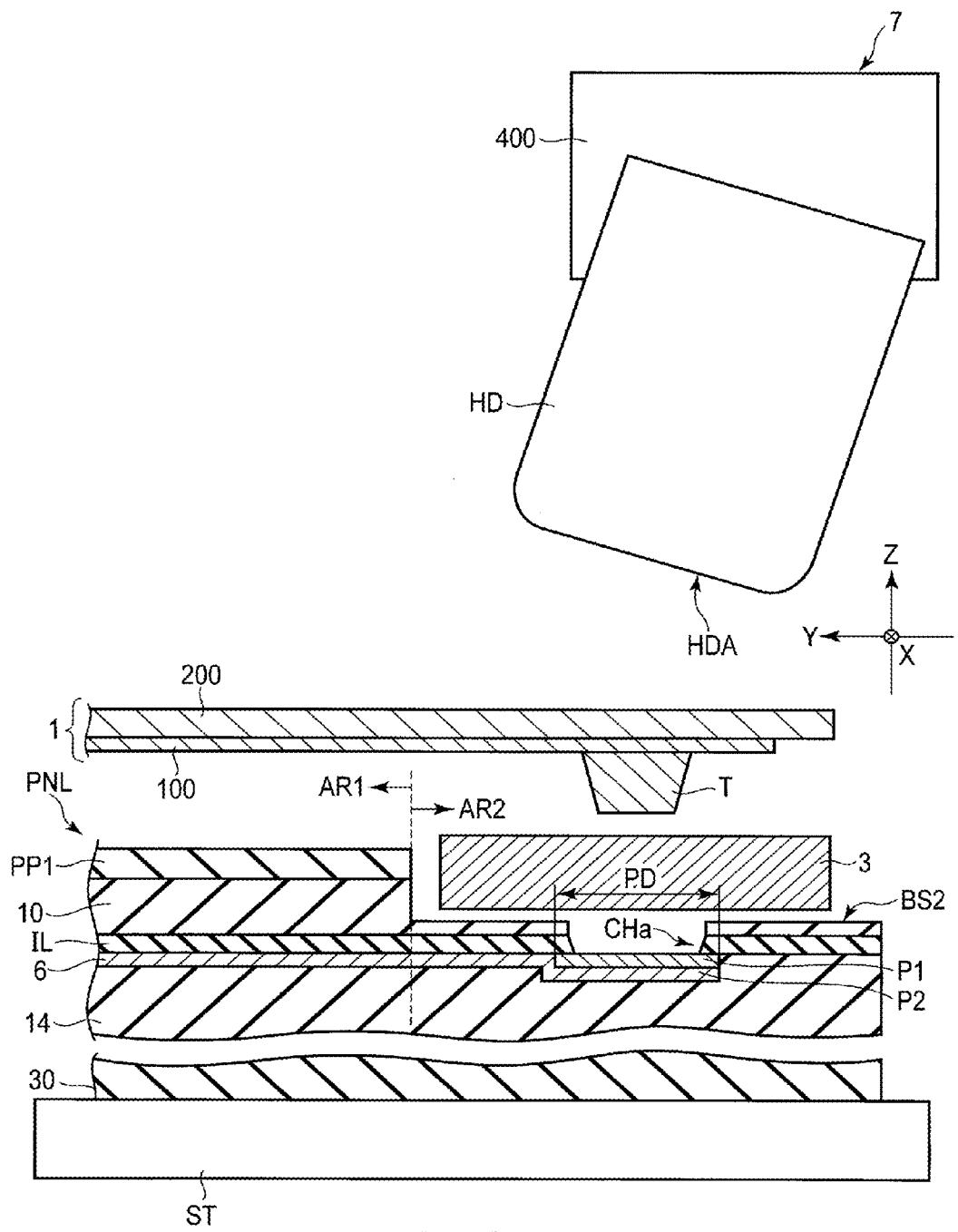
F I G. 9

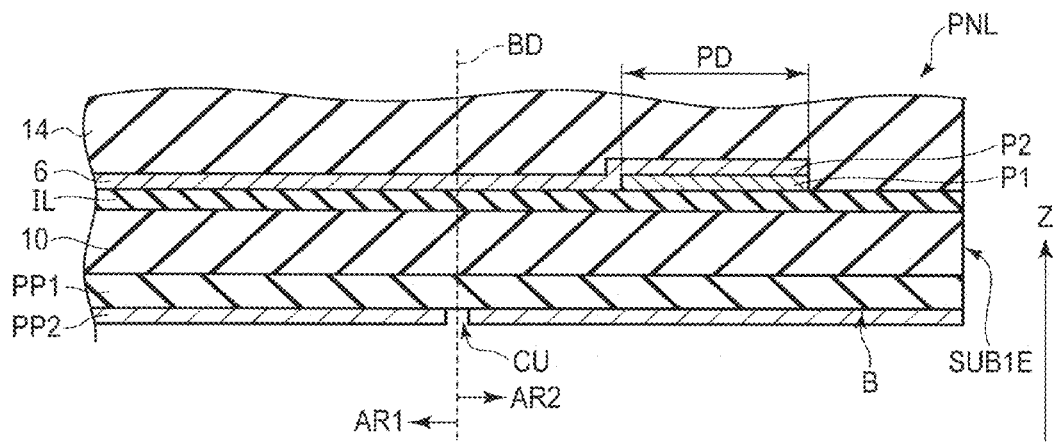
F I G. 14
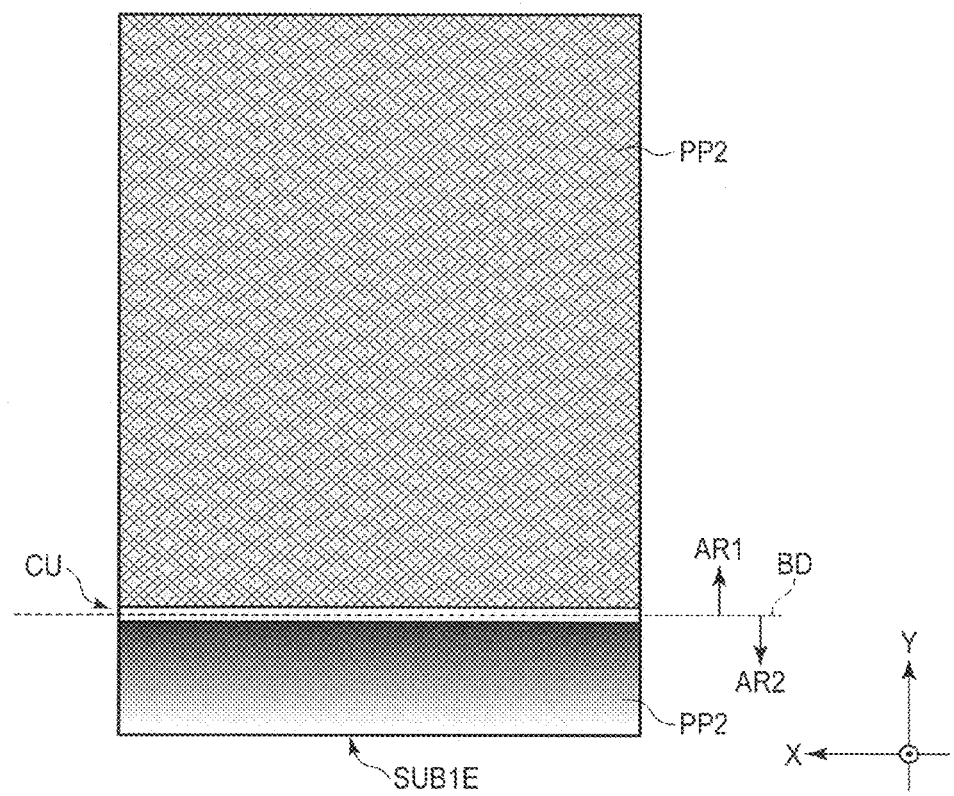
F I G. 15

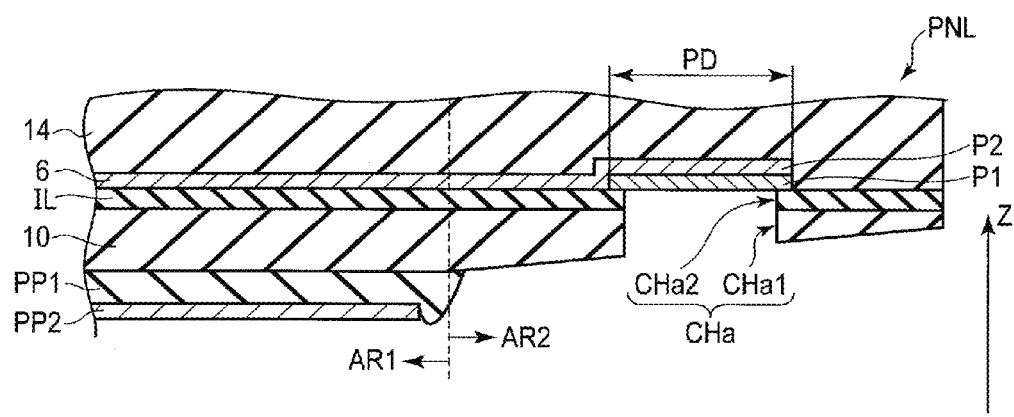
F I G. 18
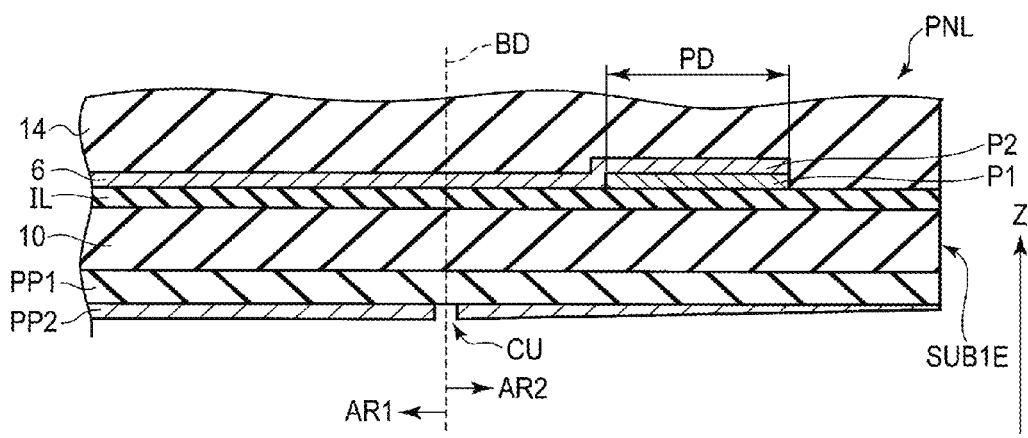
F I G. 20

DISPLAY DEVICE

CROSS-REFERENCE TO RELATED APPLICATIONS

This application is based upon and claims the benefit of priority from Japanese Patent Applications No. 2016-043412, filed Mar. 7, 2016; and No. 2016-219590, filed Nov. 10, 2016, the entire contents of all of which are incorporated herein by reference.

FIELD

Embodiments described herein relate generally to a display device.

BACKGROUND

In recent years, display devices with a greater display area on the surface are highly anticipated because of higher performance and advanced design in the technical field of mobile data communication devices such as mobile phone and personal digital assistant (PDA). For example, display devices including a thinner bezel structure are proposed.

Conventionally, there is a well-known structure in which a driver is mounted in the periphery of the display area on the substrate including electrodes. In display devices using such a structure of the driver, input signals and voltages are supplied to the driver through a line substrate such as a flexible printed circuit (FPC). On the other hand, there has been a study to omit such a flexible printed circuit but to achieve an electrical connection between lines formed on the lower surface side of an array substrate and the driver formed on the upper surface side of the array substrate through a contact hole passing through the array substrate.

BRIEF DESCRIPTION OF THE DRAWINGS

FIG. 4 is a cross-sectional view showing a part of the display device of FIG. 3 in an enlarged manner.

FIG. 5 is a cross-sectional view showing a process in which a support substrate is peeled from a first insulating substrate.

FIG. 9 is a cross-sectional view showing a process in which the display panel, anisotropy conductive film, and line substrate are mounted on a presser to press the line substrate to the display panel.

FIG. 14 is a cross-sectional view showing a process in which protection members are adhered to the first insulating substrate.

FIG. 15 is a plan view showing a distribution of the density of the protection member of FIG. 14.

FIG. 18 is a cross-sectional view showing a process in which a first contact hole is formed in the first insulating substrate.

FIG. 20 is a cross-sectional view showing a variation of the protection member of FIG. 14.

DETAILED DESCRIPTION

Figure 1:
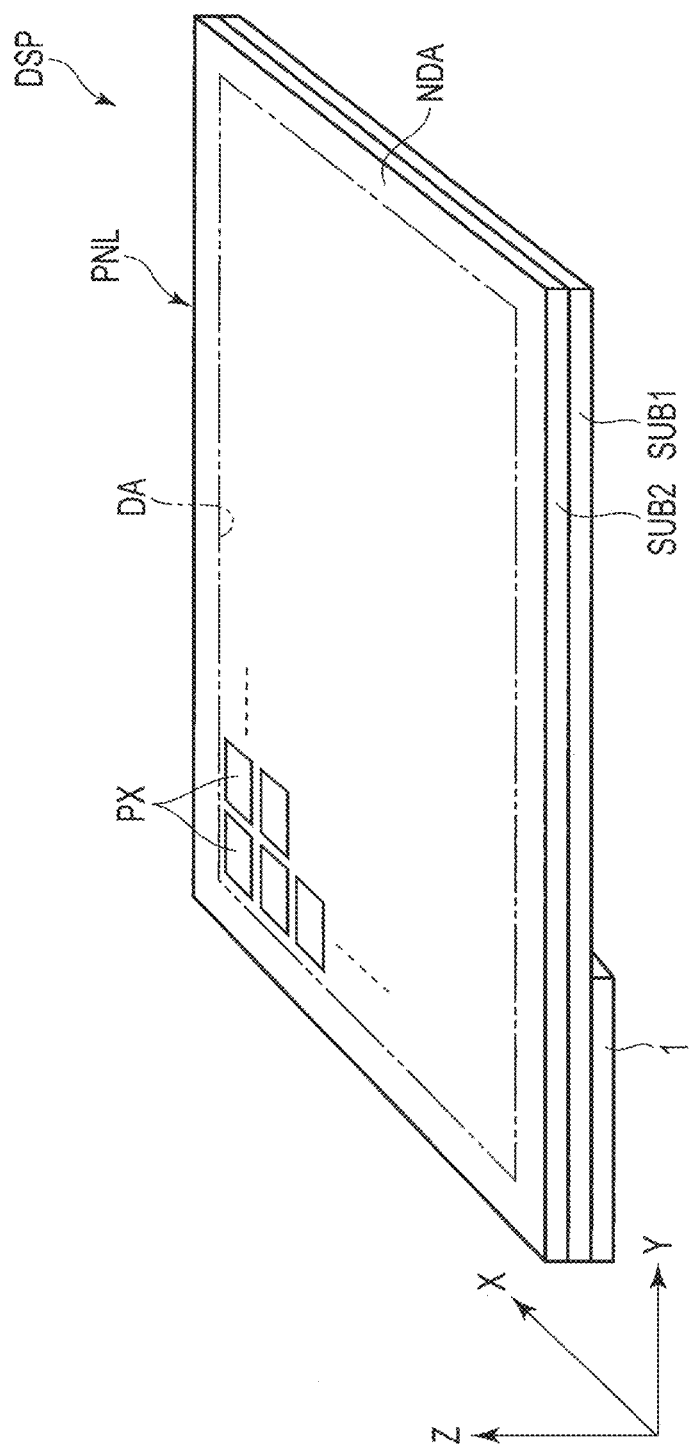
FIG. 1 is a perspective view which schematically shows the structure of a display device of a first embodiment and a second embodiment.

In general, according to one embodiment, a display device includes: a first flexible substrate including an insulating substrate including a first area, a second area adjacent to the first area, and a through hole formed in the second area, and a pad electrode disposed above the through hole; a second flexible substrate including a connection line disposed to be opposed to the through hole, the second flexible substrate disposed below the first flexible substrate; and an anisotropy conductive film which electrically connects the pad electrode and the connection line; wherein the anisotropy conductive film is disposed between the second area and the second flexible substrate, and has a first film thickness in a first position which is adjacent to the first area and a second film thickness in a second position which is closer to the through hole than is the first position, where the first film thickness is greater than the second film thickness.

According to one embodiment, a display device comprising: a first flexible substrate including an insulating substrate including a first area, a second area adjacent to the first area, and a through hole formed in the second area, and a pad electrode disposed above the through hole; a second flexible substrate including a connection line disposed to be opposed to the through hole, the second flexible substrate disposed below the first flexible substrate; and an anisotropy conductive film which electrically connects the pad electrode and the connection line, wherein the second area has a fourth film thickness in a fourth position which is adjacent to the first area and a fifth film thickness in a fifth position which is closer to the through hole than is the fourth position, where the fourth film thickness is greater than the fifth film thickness.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

Initially, a display device of a first embodiment and a second embodiment will be described.

FIG. 1 is a perspective view showing the structure of a display device DSP of the first and second embodiments schematically. A first direction X, second direction Y, and third direction Z are orthogonal to each other; however, they may cross at an angle other than 90°. The first direction X and the second direction Y are parallel to the main surface of the substrates in the display device DSP and the third direction Z corresponds to a thickness direction of the display device DSP. Furthermore, in the present embodiment, the display device is an organic electroluminescent (EL) display device.

As shown in FIG. 1, the display device DSP includes a display panel PNL and a line substrate 1. The display panel PNL includes a plate-like first substrate SUB1 and a plate-like second substrate SUB2 opposed to the first substrate SUB1.

In the present embodiment, the positive direction of a third direction Z, or the direction from the first substrate SUB1 to the second substrate SUB2 will be defined as up or above. The negative direction of the third direction Z, or the direction from the second substrate SUB2 to the first substrate SUB1 will be defined as down or below. Furthermore, phrases such as "a second member above a first member" and "a second member below a first member" may refer to either a case where the second member contacts the first member or a case where the second member is apart from the first member. In the latter case, a third member may be interposed between the first and second members. On the other hand, phrases such as "a second member on a first member" and "a second member on the bottom of a first member" refer to a case where the second member contacts the first member.

The second substrate SUB2 is disposed above the first substrate SUB1. The display panel PNL includes a display area DA in which an image is displayed and a non-display area NDA which surrounds the display area DA. The display panel PNL includes a plurality of pixels PX within the display area DA. The pixels PX are arranged in a matrix in the first direction X and the second direction Y.

In the example depicted, the first substrate SUB1 and the second substrate SUB2 are each formed in a substantial rectangular shape in the X-Y plane. Here, two side edges of the first substrate SUB1 which are parallel to the first direction X and two side edges of the second substrate SUB2 which are parallel to the first direction X have a substantially same length. That is, the width of the first substrate SUB1 in the first direction X and the width of the second substrate SUB2 in the first direction X are equal. Furthermore, two side edges of the first substrate SUB1 which are parallel to the second direction Y and two side edges of the second substrate SUB2 which are parallel to the second direction Y have a substantially same length. That is, the width of the first substrate SUB1 in the second direction Y and the width of the second substrate SUB2 in the second direction Y are equal. Thus, an area of the first substrate SUB1 which is parallel to the X-Y plane is substantially the same as an area of the second substrate SUB2 in the X-Y plane. In the present embodiment, each side edge of the first substrate SUB1 is aligned with each corresponding edge of the second substrate SUB2 in the third direction Z.

The line substrate 1 is disposed below the display panel PNL. The display panel PN and the line substrate 1 are electrically connected with each other. In the example depicted, the line substrate 1 is formed in a substantial rectangular shape in the X-Y plane. In this example, side edges of the line substrate 1 which are parallel to the first direction X have a length shorter than or equal to the side edges of the first substrate SUB1 and the second substrate SUB2 which are parallel to the first direction X. That is, the width of the line substrate 1 in the first direction X is less than or equal to the width of the first substrate Sub1 and the second substrate SUB2 in the first direction X. Furthermore, side edges of the line substrate 1 which are parallel to the second direction Y have a length shorter than or equal to the side edges the first substrate SUB1 and the second substrate SUB2 which are parallel to the second direction Y. That is, the width of the line substrate 1 in the second direction Y is less than or equal to the width of the first substrate SUB1 and the second substrate SUB2 in the second direction Y. The line substrate 1 is overlaid on the non-display area NDA and the display area DA in the third direction Z. Note that the line substrate 1 does not go outside the area opposed to the display panel PNL.

Figure 2:
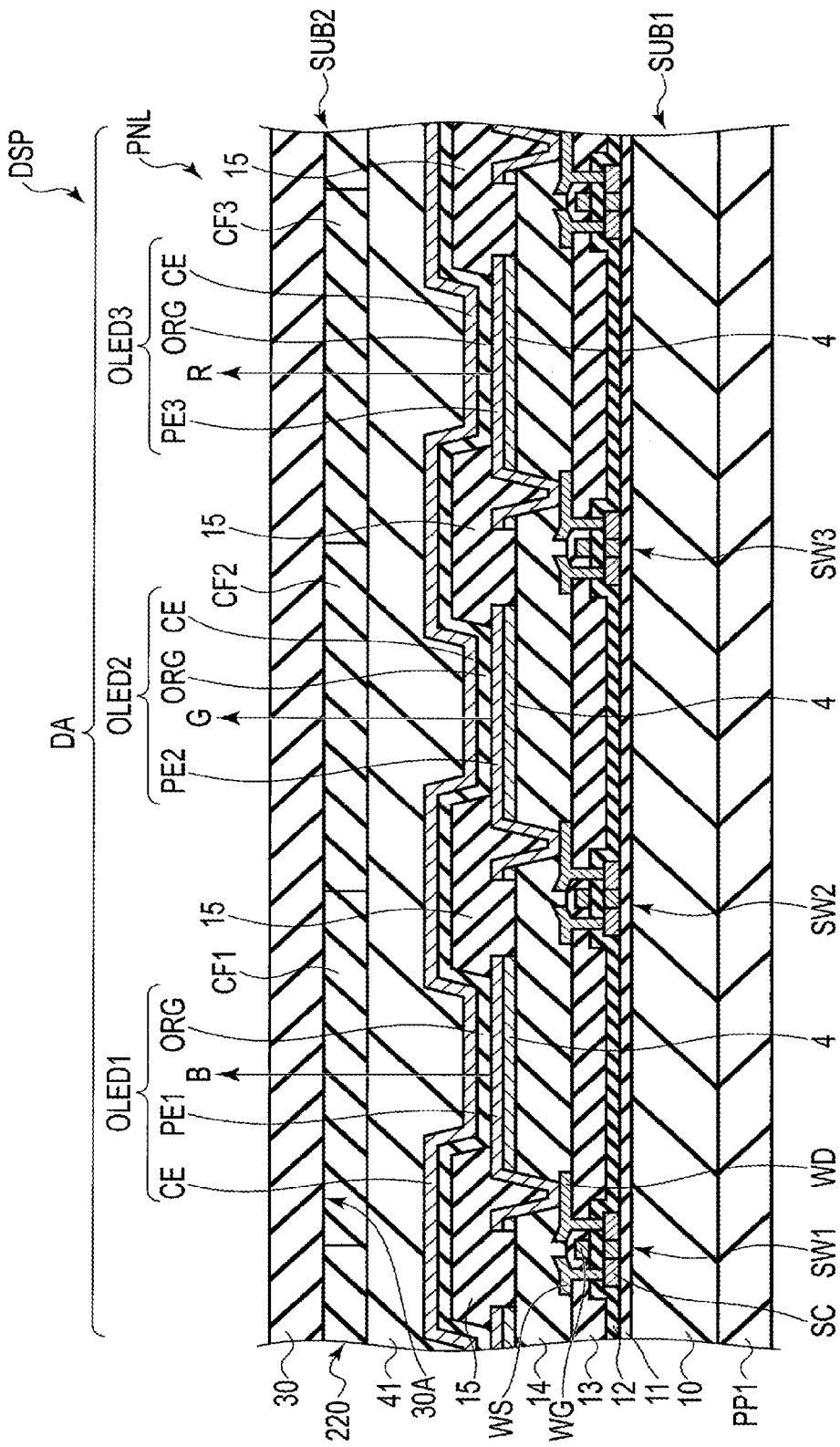
FIG. 2 is a cross-sectional view of a display area of the display device of FIG. 1.

FIG. 2 is a cross-sectional view of a display area DA of the display device DSP of FIG. 1.

As shown in FIG. 2, the first substrate SUB1 includes, for example, a first insulating substrate 10, switching elements SW1, SW2, and SW3, reflective layer 4, organic EL elements OLED1, OLED2, and OLED3, and first protection member PP1. The first insulating substrate 10 is formed of an organic insulating material which is, for example, polyimide. The first insulating substrate 10 is covered with a first insulating film 11.

Switching elements SW1, SW2, and SW3 are formed above the first insulating film 11. In the example depicted, switching elements SW1, SW2, and SW3 are of top-gate type; however, they may be of bottom-gate type. Switching elements SW1, SW2, and SW3 are structured the same, and thus, the detailed structure of switching element SW1 will be explained as a typical example. The switching elements SW1 includes a semiconductor layer SC formed on the first insulating film 11. The semiconductor layer SC is covered with a second insulating film 12. Furthermore, the second insulating film 12 is disposed on the first insulating film 11.

A gate electrode WG of the switching element SW1 is formed on the second insulating film 12 and is positioned directly above the semiconductor layer SC. The gate electrode WG is covered with a third insulating film 13. The third insulating film 13 is disposed on the second insulating film 12.

The first insulating film 11, second insulating film 12, and third insulating film 13 are formed of an inorganic material such as a silicon oxide or a silicon nitride.

A source electrode WS and a drain electrode WD of the switching element SW1 are formed on the third insulating film 13. The source electrode WS and the drain electrode WD are electrically connected to the semiconductor layer SC through a contact hole passing through the second insulating film 12 and the third insulating film 13. The switching element SW1 is covered with a fourth insulating film 14. The fourth insulating film 14 is disposed on the third insulating film 13. The fourth insulating film 14 is formed of an organic material such as transparent resin.

The reflective layer 4 is formed on the fourth insulating film 14. The reflective layer 4 is formed of a highly reflective metal material such as aluminum and silver. Note that the reflective layer 4 (that is, the surface in the second substrate SUB2 side) may have either a flat surface or an asperity for light dispersion.

Organic EL elements OLED1 to OLED3 are formed above the fourth insulating film 14. In the example depicted, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is structured as a top-emission type which emits whit light toward the second substrate SUB2. The organic EL elements OLED1 to OLED3 have the same structure.

The organic EL elements OLED1 includes a positive electrode PE1 formed on the reflective layer 4. The positive electrode PE1 contacts the drain electrode WD of the switching element SW1 and is electrically connected to the switching element SW1. Similarly, the organic EL element OLED2 includes a positive electrode PE2 which is electrically connected to the switching element SW2 and the organic EL element OLED3 includes a positive electrode PE3 which is electrically connected to the switching element SW3. The positive electrodes PE1, PE2, and PE3 are formed of a transparent conductive material such as indium tin oxide (ITO) or indium zinc oxide (IZO).

The organic EL elements OLED1 to OLED3 each include an organic light emitting layer ORG and a common electrode (negative electrode) CE. The organic light emitting layer ORG is disposed on each of the positive electrodes PE1 to PE3. The common electrode CE is positioned above the organic light emitting layer ORG. The common electrode CE is formed of a transparent conductive material such as ITO or IZO. In the example depicted, the organic EL elements OLED1 to OLED3 are defined by ribs 15. Note that, although this is not depicted, each of the organic EL elements OLED1 to OLED3 is, preferably, sealed by a transparent shielding film.

The second substrate SUB2 includes a second insulating substrate 30, a color filter layer 220 and the like. The second insulating substrate 30 may be a glass substrate or a resin substrate, or may be an optical device including an optical film, a polarizer, or the like.

The color filter layer 220 is disposed in the inner surface 30A side of the second insulating substrate 30. The color filter layer 220 includes color filters CF1, CF2, and CF3. The color filters CF1, CF2, and CF3 are formed of resin materials of different colors. In this example, the color filter CF1 is a blue color filter. The color filter CF2 is a green color filter. The color filter CF3 is a red color filter. Note that the color filter layer 220 may further include a white or a transparent color filter. The color filters CF1, CF2, and CF3 are opposed to the organic EL elements OLED1, OLED2, and OLED3, respectively.

The display element part 120 of the first substrate SUB1 and the second substrate SUB2 are adhered together by a transparent adhesive layer 41. As will be described later, the first substrate SUB1 and the second substrate SUB2 may be adhered by a sealant surrounding the adhesive layer 41 in the non-display area NDA in addition to the adhesive layer 41.

The first protection member PP1 is disposed below the first insulating substrate 10. In the example, the first protection member PP1 is adhered to the bottom of the first insulating substrate 10; however, an additional thin film may be interposed between the first protection member PP1 and the first insulating substrate 10. The first protection member PP1 is, preferably, formed of a material which exerts a good heat resistivity, gas insulation, anti-humidity, and rigidity, and also is cheap. The first protection member PP1 exerts a heat resistivity such that it does not change or deform in a process temperature during a manufacturing process of the display device DSP. Furthermore, the first protection member PP1 has a strength greater than that of the first insulating substrate 10 and functions as a supportive layer which suppresses bending of the display panel PNL. Furthermore, the first protection member PP1 has an anti-humidity property to keep water or the like from entering the inside and a gas insulation property to keep gas or the like from entering the inside, and functions as a barrier layer. In the present embodiment, the first protection member PP1 is a film formed of, for example, polyethylene terephthalate.

As will be described later, a metal layer may be formed below the first protection member PP1. The metal layer is, for example, a thin film deposited on the first protection member PP1. The metal layer is, preferably, formed of a material which exerts gas insulation greater than that of the first protection member PP1 in consideration of the manufacturing process which will be described later. The second protection member PP2 is formed of, for example, aluminum or an aluminum alloy. Note that a different thin film may be interposed between the first protection member PP1 and the metal layer.

In the above display device DSP, when the organic EL elements OLED1 to OLED3 emit light, the light (white light) therefrom exits through the color filters CF1, CF2, and CF3. Therein, the light of blue wave length in the white light irradiated from the organic EL element OLED1 passes the color filter CF1. The light of green wave length in the white light irradiated from the organic EL element OLED2 passes the color filter CF2, and the light of red wave length in the white light irradiated from the organic EL element OLED3 passes the color filter CF3. Therefore, color image display can be achieved.

A pixel PX shown in FIG. 1 is, for example, a minimum unit of a color image, and includes the above-described organic EL elements OLED1 to OLED3.

Note that, in the above example, the organic EL elements OLED1 to OLED3 include a common organic light emitting layer ORG; however, no limitation is intended thereby. For example, the organic EL elements OLED1 may include an organic light emitting layer which emits blue light, the organic EL element OLED2 may include an organic light emitting layer which emits green light, and the organic EL elements OLED3 may include an organic light emitting layer which emits red light, and in such a structural example, the color filter layer 220 may be omitted.

Now, the structure of the non-display area NDA of the display device DSP of the first embodiment will be described.

Figure 3:
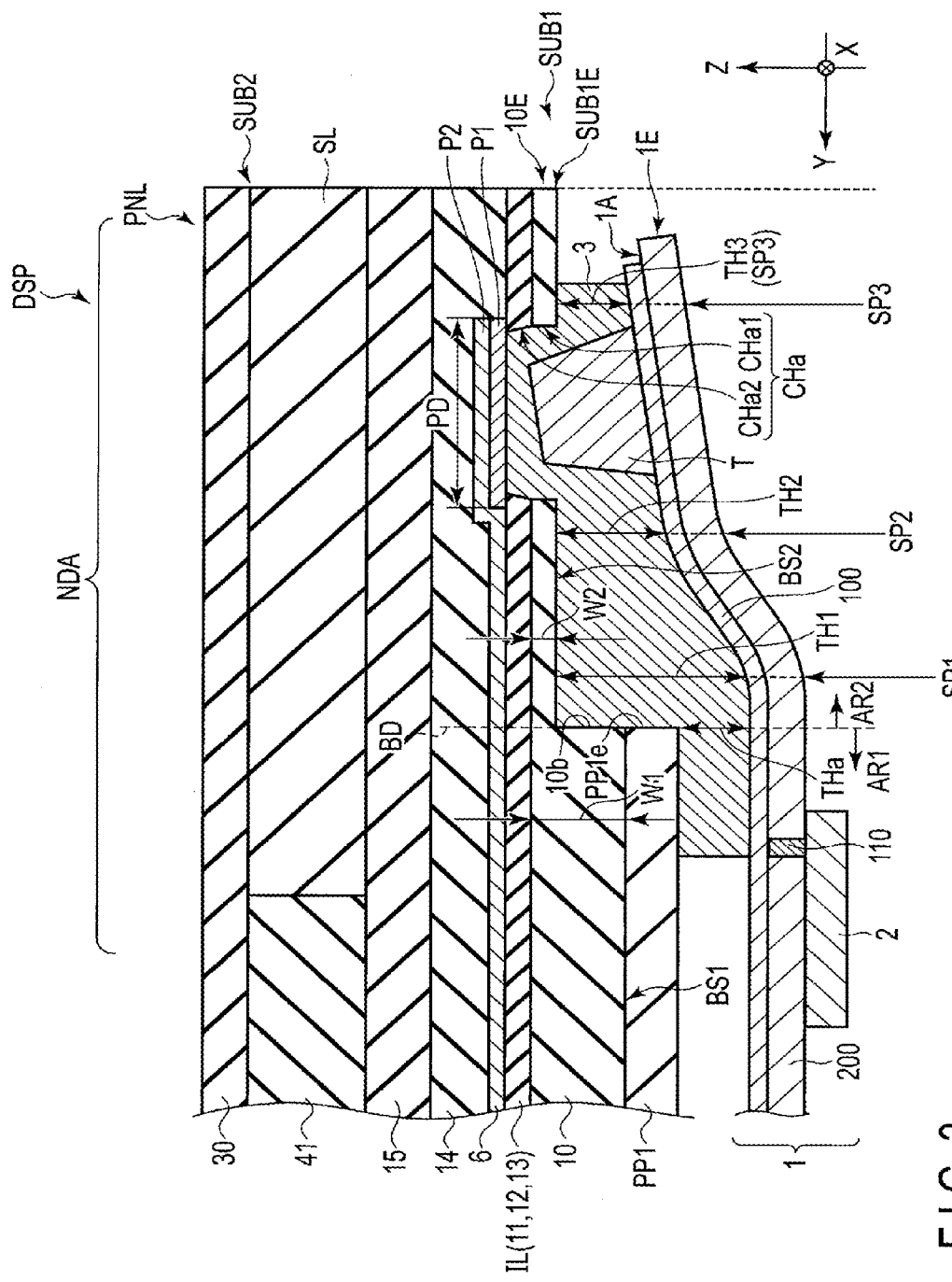
FIG. 3 is a cross-sectional view of the display device including a non-display area of FIG. 1.

FIG. 3 is a cross-sectional view of the display device DSP including the non-display area NDA of FIG. 1. Note that, in this example, the structure of the second substrate SUB2 is substantially the same as in FIG. 2, and thus, the detailed structure thereof will not be mentioned. Furthermore, in this specification, viewing the first substrate SUB1 from the second substrate SUB2 will be defined as a plan view.

As shown in FIG. 3, the first substrate SUB1 and the second substrate SUB2 are adhered together with a sealant SL in addition to the adhesive layer 41. The sealant SL is formed in the non-display area NDA. The adhesive layer 41 is in an area defined by the first substrate SUB1, second substrate SUB2, and sealant SL. Note that the adhesive layer 41 and the sealant SL may be formed of either the same material or different materials.

The first protection member PP1 does not extend to an end SUB1E of the first substrate SUB1 and is cut halfway in the non-display area NDA. The first insulating substrate 10 includes a first area AR1 and a second area AR2 adjacent to each other. The second area AR2 is closer to the end SUB1E than is the first area AR1. The first area AR1 corresponds to an area of the first insulating substrate 10 overlapping the first protection member PP1 in the third direction Z, and the second area AR2 corresponds to an area of the first insulating substrate 10 not overlapping the first protection member PP1 in the third direction Z. That is, the first protection member PP1 is disposed overlapping the first area AR1 below thereof and is not disposed below the second area AR2.

The first insulating substrate 10 has a thickness W1 in the first area AR1 and a thickness W2 in the second area AR2. The thickness W2 is less than the thickness W1. In the present embodiment, the thickness W1 is approximately 10 to 20 μm, and the thickness W2 is 1 μm or less, for example.

Note that the first insulating substrate 10 has a first lower surface BS1 in the first area AR1 and a second lower surface BS2 in the second area AR2, and the second lower surface BS2 is disposed above the first lower surface BS1. Here, the first lower surface BS1 and the second lower surface BS2 are parallel to the X-Y plane. The first lower surface BS1 contacts the first protection member PP1.

A pad electrode PD is formed above the first insulating substrate 10. As shown in FIG. 2, the first insulating film 11, second insulating film 12, and third insulating film 13 are disposed between the pad electrode PD and the first insulating substrate 10. Here, an insulating film including the first to third insulating films 11 to 13 will be referred to as an insulating film IL. That is, the insulating film IL is a layered structure of the insulating films disposed between the pad electrode PD and the first insulating substrate 10. In the example depicted, the pad electrode PD is a multilayer including electrodes P1 and P2. The electrode 21 is a transparent conductive layer formed of, for example, indium tin oxide as a transparent conductive material. The electrode P2 is disposed above the electrode P1 and is formed of a conductive material such as a metal material. The electrode P1 is formed in, for example, an island shape.

A contact hole CHa is formed passing through the first insulating substrate 10 and the insulating film IL to reach the pad electrode PD. The contact hole CHa includes a first contact hole CHa1 formed in the second area AR2 in the first insulating substrate 10 and a second contact hole CHa2 formed in the insulating film IL, which are continued together. Here, the first contact hole CHa1 corresponds to a through hole formed in the second area AR2 of the first insulating substrate 10. The pad electrode PD is formed above the first contact hole CHa1 and the second contact hole CHa2. The pad electrode PD and the contact hole CHa are positioned to overlap the sealant SL in the third direction Z and also the second area AR2 of the first insulating substrate 10.

A signal line 6 is, in the example depicted, formed on the insulating film IL and is formed in the same layer where the pad electrode PD is disposed. The signal line 6 is electrically connected to the pad electrode PD. The signal line 6 and the pad electrode PD may be formed separately or integrally. In the example depicted, the signal line 6 is formed integrally with the electrode P2 of the pad electrode PD. The signal line 6 corresponds to the gate line G and source line S of FIG. 2, a power source line, and various control lines. The fourth insulating film 14 covers the signal line 6, pad electrode PD, and third insulating film 13.

Note that, the signal line 6 and the pad electrode PD may be disposed in different layers. Furthermore, the signal line 6 and the pad electrode PD may be formed in different layers such that the signal line 6 and the pad electrode PD are electrically connected through a contact hole formed in an interlayer insulating film therebetween.

The first substrate SUB1 corresponds to a first flexible substrate shape of which is flexible to an external force. The second substrate SUB2 corresponds to a counter substrate which is opposed to the first flexible substrate and disposed above the first flexible substrate.

The line substrate 1 is disposed below the first substrate SUB1. The line substrate 1 includes a core substrate 200, a connection line 100 disposed on the surface of the core substrate 200 to be opposed to the display panel PNL, and driver 2 disposed below the core substrate 200. The core substrate 200 is disposed below both the first area AR1 and the second area AR2. The connection line 100 is disposed such that at least a part thereof is disposed in a position to be opposed to the contact hole CHa in the third direction Z.

The connection line 100 includes a projection T. The projection T projects toward the first substrate SUB1. The projection T is formed such that at least a part thereof is disposed inside the contact hole CHa. The projection T is formed on, for example, the connection line 100 through plating or the like.

The driver 2 is electrically connected to the connection line 100 through a through hole 110 formed in the core substrate 200. The driver 2 functions as, for example, a signal supplier which supplies a signal to the display panel PNL for its drive. In the example depicted, the driver 2 is disposed below the core substrate 200; however, no limitation is intended thereby, and it may be disposed above the core substrate 200.

The display panel PNL and the line substrate 1 are electrically connected and adhered together with an anisotropy conductive film 3 which is a conductive material. Specifically, the anisotropy conductive film 3 includes conductive particles (conductive particles CP which will be described later) dispersed in an adhesive agent. When the anisotropy conductive film 3 is interposed between the line substrate 1 and the display panel PNL, they are pressed vertically in the third direction Z and heated to achieve electrical and physical connection therebetween. The anisotropy conductive film 3 is, between the display panel PNL and the line substrate 1, filled inside the contact hole CHa from the lower surface of the first insulating substrate 10 to contact and electrically connect with the first electrode P1 of the pad electrode PD. Furthermore, the anisotropy conductive film 3 contacts and electrically connects with the projection T of the connection line 100. Thereby, the connection line 100 is electrically connected to the pad electrode PD and the signal line 6 through the anisotropy conductive film 3.

In the present embodiment, the line substrate 1 or the core substrate 200 is inclined with respect to the second lower surface BS2 in the area where the first insulating substrate is opposed to the second area AR2. That is, given that the surface of the line substrate 1 opposed to the display panel PNL is surface 1A, the surface 1A is inclined with respect to the second lower surface BS2. Furthermore, the connection line 100 is inclined with respect to the pad electrode PD along the inclination of the line substrate 1. The substrate end 1E of the line substrate 1 is positioned below the second area AR2 in the third direction Z. Note that the substrate end 1E does not go outside the position of the first insulating substrate 10 opposed to the substrate end 10E.

The line substrate 1 corresponds to a second flexible substrate shape of which is flexible to an external force.

The above anisotropy conductive film 3 is disposed between the display panel PNL and the line substrate 1. In the example depicted, the anisotropy conducive film 3 is disposed to be apart from the first lower surface BS1 and to contact the second lower surface BS2. The anisotropy conductive film 3 is disposed between the first area AR1 and the line substrate 1. In the example depicted, the anisotropy conductive film 3 is disposed below the first protection member PP1 in a position overlapping the first area AR1. That is, the first protection member PP1 is disposed between the anisotropy conductive film 3 and the first area AR1. The anisotropy conductive film 3 covers the surface 10b of the first insulating substrate 10 in a boundary surface BD between the first area AR1 and the second area AR2. Furthermore, the anisotropy conductive film 3 covers the end surface PP1e of the first protection member PP1.

The anisotropy conductive film 3 is disposed between the second area AR2 and the line substrate 1. Since the line substrate 1 is inclined in the area opposed to the second area AR2, the thickness of the anisotropy conductive film 3 differs in some positions in the area opposed to the second area AR2. The anisotropy conductive film 3 has a first film thickness TH1 in a first position SP1 adjacent to the first area AR1, second film thickness TH2 in a second position SP2 which is closer to the contact hole CHa than is the first position SP1, and third film thickness TH3 in a third position SP3 which is closer to the substrate end 10E than is the contact hole CHa. The first film thickness TH1 is greater than the second film thickness TH2. In the example depicted, the second film thickness TH2 is greater than the third film thickness TH3. The size relationship of the first film thickness TH1, second film thickness TH2, and third film thickness TH3 is the same in the first direction X.

In the example of FIG. 3, the line substrate 1 is curved from the first position SP1 to the second position SP2. Furthermore, in the example of FIG. 3, the line substrate 1 is flat from the second position SP2 to the third position SP3. Note that the line substrate 1 may be flat from the first position SP1 to the second position SP2 and may be curved from the second position SP2 to the third position SP3. Furthermore, the line substrate 1 may be flat or curved throughout the first position SP1 to the third position SP3.

Note that, in a position overlapping the surface 10b, a film thickness THa between the display panel PNL and the line substrate 1 is, for example, 10 μm or more.

FIG. 4 is a cross-sectional view showing a part of the display device DSP of FIG. 3 in an enlarged manner, in which the periphery of the anisotropy conductive film 3 is depicted.

As shown in FIG. 4, the anisotropy conductive film 3 includes a plurality of conductive particles CP. A conductive particle CP1 is interposed between the pad electrode PD and the connection line 100 in the contact hole CHa. When the line substrate 1 is pressed against the display panel PNL, the conductive particle CP1 is crushed between the projection T and the pad electrode PD to establish electrical connection between the display panel PNL and the line substrate 1.

Furthermore, in the example depicted, conductive particles CP2 in the anisotropy conductive film 3 are interposed between the second area AR2 and the connection line 100 outside the contact hole CHa. The conductive particles CP2 may have different diameters in the third direction Z depending on their positions. In the example depicted, the diameters in the third direction Z of the conductive particles CP2 increase toward the first position SP1 from the third position SP3. The conductive particle CP1 and CP2 may be, for example, entirely formed of a metal or may be formed of a resin material coated with a metal material such as nickel or gold.

Note that, between the line substrate 1 and the display panel PNL, two or more conductive particles CP are not made conductive while being stacked in the third direction Z. Furthermore, for example, in both the first direction X and second direction Y, an adhesive agent (insulative material) which is a material for the anisotropy conductive film 3 is filled between adjacent conductive particles CP, and thus, the conductive particles CP are rarely made conductive in both the first direction X and second direction Y.

Note that the surface of the connection line 100 which contacts the anisotropy conductive film 3 may have the projection T as shown or may be flat without any projection. With the projections T formed as above, a greater number of conductive particles CP1 between the connection line 100 and the pad electrode PD can be crushed by the projections T. Thereby, the electric connection between the connection line 100 and the pad electrode PD can be established more firmly with a smaller pressure force. Thus, as compared to a case where there is no projection T, a productivity and reliability of both the product and its production can be improved.

Now, a manufacturing method of the display device of the first embodiment will be explained with reference to FIGS. 5 to 10. In FIGS. 5 to 10, the structure above the pad electrode PD is equal to that of the pad electrode PD of the display panel PNL of FIG. 3, and thus, the depiction thereof is omitted.

FIG. 5 is a cross-sectional view of a process in which a support substrate 5 is peeled off from the first insulating substrate 10. That is, on the support substrate 5, members of the first substrate SUB1 including the first insulating substrate 10, insulating film 11, pad electrode PD, signal line 6 and the like are formed one after another, and the second substrate SUB2 is adhered thereto.

Then, laser LL1 is irradiated from the rear surface side of the support substrate 5 to peel the support substrate 5 from the first insulating substrate 10. Here, in the present embodiment, the support substrate 5 is formed of glass and the first insulating substrate 10 is formed of polyimide. The laser LL1 irradiated from the rear surface side of the support substrate 5 reaches the surface 10A of the first insulating substrate 10. The first insulating substrate 10 absorbs and resolves the laser LL1 at the interface between the support substrate 5 and the first insulating substrate 10. Thereby, a space is created at the interface between the support substrate 5 and the first insulating substrate 10, and the support substrate 5 is peeled off from the first insulating substrate 10.

Figure 6:
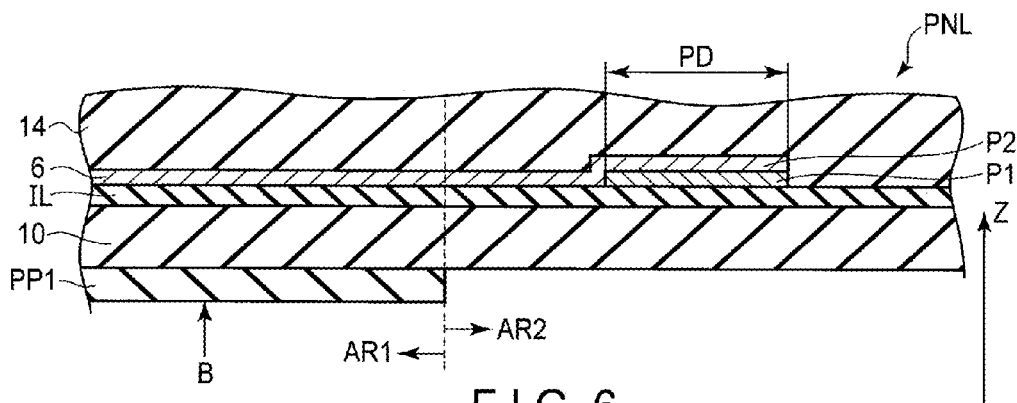
FIG. 6 is a cross-sectional view showing a process in which a protection member is adhered to the first insulating substrate.

FIG. 6 is a cross-sectional view showing a process in which the first protection member PP1 is adhered to the first insulating substrate 10.

The first protection member PP1 is adhered to the first insulating substrate 10 with an adhesive sheet which is not shown. Specifically, while the adhesive sheet is disposed between the first insulating substrate 10 and the first protection member PP1, alignment of the first protection member PP1 is performed, and a heat treatment is performed to make the adhesive sheet adhesive to adhere the first protection member PP1 to the bottom of the first insulating substrate. Thereby, a misalignment of the first protection member PP1 can be suppressed.

Note that, before adhering the first protection member PP1 to the first insulating substrate 10, a metal layer may be formed on the surface B of the first protection member PP1. The metal layer is formed by, for example, depositing a metal material on the surface B of the first protection member PP1.

Figure 7:
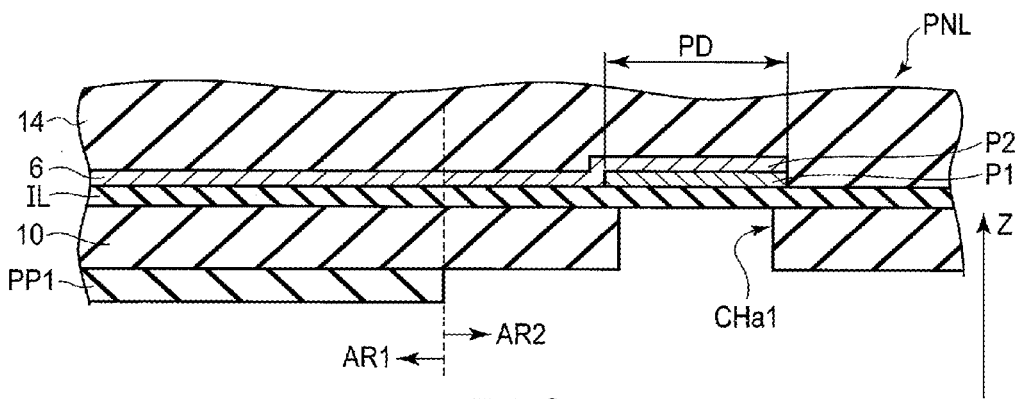
FIG. 7 is a cross-sectional view showing a process in which a first contact hole is formed in the first insulating substrate.

FIG. 7 is a cross-sectional view showing a process in which a first contact hole CHa1 is formed in the first insulating substrate 10.

After the first protection member PP1 is adhered, the first contact hole CHa1 is formed in the first insulating substrate 10. Specifically, laser is irradiated from the lower side of the first substrate SUB1 toward the area overlapping the pad electrode PD, the first contact hole CHa1 reaching the insulating film IL is formed in the second area AR2 of the first insulating substrate 10. In the present embodiment, laser with a wavelength of 258 nm or less should be used. Note that, in the process forming the first contact hole CHa1 of FIG. 7 may be performed before the adhering process of the first protection member PP1 of FIG. 6.

Figure 8:
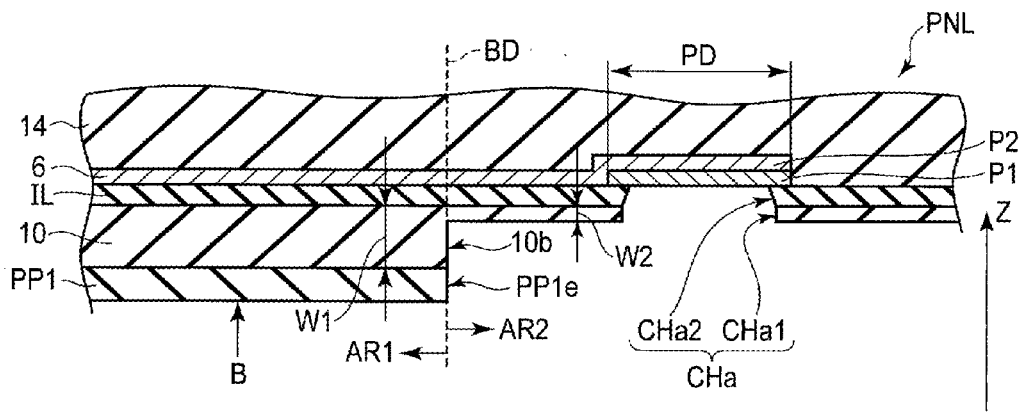
FIG. 8 is a cross-sectional view showing a process in which the first insulating substrate is thinned in the second area and a second contact hole is formed in an insulating film.

FIG. 8 is a cross-sectional view showing a process in which the first insulating substrate 10 is thinned in the second area AR2 and a second contact hole CHa2 is formed in the insulating film IL.

After the first contact hole Cha1 is formed in the first insulating substrate 10, a second contact hole CHa2 is formed in the insulating film IL. The insulating film IL is trimmed in the first contact hole CHa1 through an ashing process to form the second contact hole CHa2. The second contact hole CHa2 is formed in a position overlapping the first contact hole CHa1. The second contact hole CHa2 continues to the first contact hole CHa1, and is formed between the pad electrode PD and the first contact hole CHa1. A gas used in the ashing process is, for example, sulfur hexafluoride (SF6).

Furthermore, in the same process where the second contact hole CHa2 is formed, the first insulating substrate 10 is thinned in the second area AR2. Specifically, the first insulating substrate 10 exposed in the second area AR2 is trimmed by the ashing process to form the second contact hole CHa2. The first insulating substrate 10 in the first area AR1 is not trimmed since it is covered with the first protection member PP1 and the second protection member PP2. Thus, the thickness W1 of the first area AR1 is maintained as is before the ashing process, and the second area AR2 becomes thinner than the first area AR1. Here, the first protection member PP1 functions as a mask to prevent fragments from the first area AR1 in the ashing process. Furthermore, if a metal layer is formed on the surface B of the first protection member PP1, the metal layer has a resistance to the gas used in the ashing process, fragments from the first protection member PP1 and deterioration in the properties required for the first protection member PP1 (such as heat resistivity, gas insulation, anti-humidity, and strength) can be suppressed.

Here, the insulating film IL and the first insulating substrate 10 react to the gas used in the ashing process in different speeds. Thus, in consideration of the reaction speed of each of the insulating film IL and the first insulating substrate 10 in the ashing process, the thickness thereof before the ashing process is determined. Thus, in the second area AR2, the first insulating substrate 10 can be trimmed to a desired thickness W2 while the insulating film IL is trimmed and pierced to reach the pad electrode PD.

As can be understood from the above, the process of forming the second contact hole CHa2 of the insulating film IL and the process of thinning the first insulating substrate 10 can be performed concurrently in the present embodiment. Consequently, the first insulating substrate 10 can be thinned without an additional process. Furthermore, the production cost can be suppressed.

As can be understood from the above, the ashing process of the first insulating substrate 10 is performed using the first protection member PP1 as a mask, and thus, the surface 10b between the first area AR1 and the second area AR2 is positioned directly above the end surface PP1e. Furthermore, the surface 10b and the end surface PP1e are positioned above the boundary surface HD.

FIG. 9 is a cross-sectional view showing a process in which the display panel PNL, anisotropy conductive film 3, and line substrate 1 are mounted on a presser 7 to press the line substrate 1 to the display panel PNL.

Initially, the structure of the presser 7 will be explained. The presser 7 includes a press head HD, moving mechanism 400 which moves the press head HD, and stage ST on which the display panel PNL is mounted. The press head HD includes a surface HDA which is opposed to the stage ST. In the example depicted, the surface HDA is flat and is inclined with respect to the stage ST. Note that the surface HDA extends in the first direction X in substantially the same shape. As will be described later, the shape of the surface HDA is not limited to the example depicted, and may be curved. The moving mechanism 400 includes an elevator mechanism which moves the press head HD in both a direction close to and a direction apart from the stage ST. Note that the moving mechanism 400 may move the press head HD in the normal (third direction Z) of the stage ST or may move the press head HD in a diagonal direction with respect to the normal of the stage ST, or may move the press head HD combining directions of the normal and a direction orthogonal to the normal. In the following description, the positive direction of the third direction Z or a direction from the stage ST tot the press head HD will be defined as up or above, and the negative direction of the third direction Z or a direction from the press head HD to the stage ST will be defined as down or below.

In a standby stage depicted, the press head HD is fixed to a position apart from the stage ST such that workpieces (display panel PNL, anisotropy conductive film 3, and line substrate 1) can be mounted on the stage ST. The display panel PNL is disposed above the stage ST. The line substrate 1 is disposed above the display panel PNL. The anisotropy conductive film 3 is disposed between the line substrate 1 and the display panel PNL in a position to be opposed to the contact hole CHa. At that time, for example, the anisotropy conductive film 3 is approximately 20 µm in thickness in the third direction Z and approximately 0.6 mm in width in the second direction Y.

Figure 10:
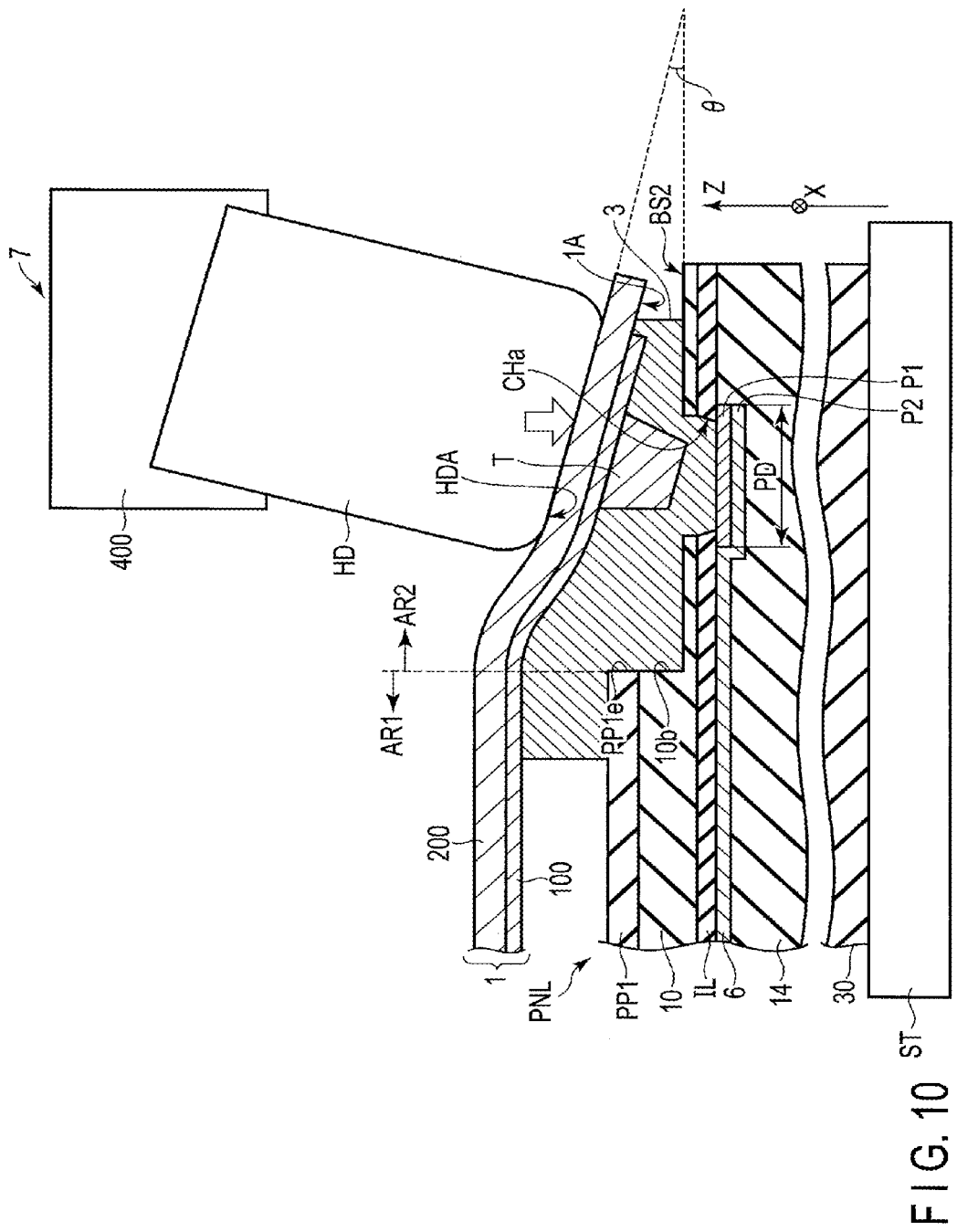
FIG. 10 is a cross-sectional view showing a process in which the display panel is pressed to the line substrate.

FIG. 10 is a cross-sectional view showing a process in which the line substrate 1 is pressed to the display panel PNL.

The moving mechanism 400 moves the press head HD toward the line substrate 1 and presses the press head HD against the display panel PNL from above the line substrate 1. At that time, for example, the moving mechanism 400 moves the press head HD in the third direction Z. That is, the moving mechanism 400 moves the press head HD vertically with respect to the second lower surface BS2 of the second area AR2 and presses the line substrate 1 against the first insulating substrate 10. Note that a buffer or a heat diffusion sheet may be disposed between the press head HD and the line substrate 1.

Then, heat is applied to the line substrate 1 while a pressure is applied to the line substrate 1 in the arrow direction (the negative direction of the third direction Z) of FIG. 10. Thus, the anisotropy conductive film 3 is melt and enters inside the contact hole CHa, and conductive particles in the anisotropy conductive film 3 contact the pad electrode PD and the display panel PNL and the line substrate 1 are electrically and physically connected. That is, the core substrate 200 as a second flexible substrate is pressed and fixed to the first insulating substrate 10 as a first flexible substrate.

At that time, in the area where the surface 1A of the line substrate 1 is opposed to the second area AR2, the press head HD is pressed against the line substrate 1 by the moving mechanism 400 such that the press head HD is inclined with respect to the second lower surface BS2. That is, the moving mechanism 400 presses the press head HD against the line substrate 1 while the surface HDA of the press head HD is inclined with respect to the second lower surface BS2. The surface HDA and the surface 1A are substantially parallel in the area overlapping the second area AR2. The surface HDA and the second lower surface BS2 form an acute angle θ. Therefore, the anisotropy conductive film 3 starts between the second area AR2 and the line substrate 1 expanding in between the first area AR1 and the line substrate 1 to cover the surface 10b and the first protection member PP1. Therefore, in the anisotropy conductive film 3, the first film thickness TH1, second film thickness TH2, third film thickness TH3, and film thickness THa as in FIG. 3 are achieved.

Through the above processes, the line substrate 1 is pressed and fixed to the display panel PNL.

In the present embodiment, the line substrate 1 is inclined in the area overlapping the second area AR2. Furthermore, in the area overlapping the second area AR2, the anisotropy conducive film 3 increases in thickness toward the first area AR1 along the inclination of the line substrate 1, and the anisotropy conductive film 3 is disposed in the position overlapping the first area AR1. Thus, the anisotropy conductive film 3 functions as a buffer between the line substrate 1 and the display panel PNL, and increase in curvature of the line substrate 1 caused by a height difference in the surface 10b of the first insulating substrate 10 can be suppressed. Therefore, a possible breakdown of lines in the line substrate 1 such as connection line 100 and the like can be avoided, and the productivity can be improved.

Furthermore, the anisotropy conductive film 3 covers the surface 10b and the end surface PP1e of the first protection member PP1. Thus, the anisotropy conductive film 3 can prevent moisture or the like from entering the inside through the surface 10b. Furthermore, the adhesion between the first insulating substrate 10 and the first protection member PP1 can be improved.

Furthermore, in the present embodiment, the first insulating substrate 10 is thinner in the second area AR2 than is in the first area AR1. Therefore, as in FIG. 4, even if the conductive particles CP2 are interposed and pressed between the connection line 100 and the first insulating substrate 10, a gap between the pad electrode PD and the projection T of the connection line 100 in a position opposed to the contact hole CHa can be decreased to sufficiently press the conductive particle CP1. That is, the conductive particle CP1 between the connection line 100 and the pad electrode PD can be pressed and crushed before the conductive particles CP2 are lodged between the connection line 100 and the first insulating substrate 10. Thus, the connection between the connection line 100 and the pad electrode PD can be established more efficiently.

Furthermore, in the present embodiment, the display device DSP includes the line substrate 1 disposed below the display panel PNL (in the rear surface side which is opposite to the display surface) wherein the line substrate 1 and the display panel PNL are electrically connected through the conductive material (anisotropy conductive film 3 in the above example) in the contact hole CHa. Furthermore, the driver 2 is disposed below the display panel PNL. Since the area of the first substrate SUB1 is not required to be enlarged to mount the driver 2 or the line substrate 1 thereon, the first substrate SUB1 and the second substrate SUB2 can be formed substantially even. Furthermore, in the area where the first substrate SUB1 and the second substrate SUB2 are opposed to each other, the display area DA can be increased. That is, in the display surface of the display device DSP of the present embodiment, the area of the display area DA used for display can be increased, and a thinner bezel structure can be achieved.

Furthermore, since there is no need of a long flexible printed circuit used for the electrical connection between the part of the first substrate SUB1 which is opposed to the second substrate SUB2 and the line substrate 1, or a space to accommodate a bent flexible printed circuit, the display device DSP can be miniaturized. Furthermore, an electronic device including the display device DSP can be miniaturized, too.

Furthermore, since a possible breakdown of the lines when the flexible printed circuit is bent can be avoided, the display device DSP can be made more reliable.

As can be understood from the above, the present embodiment can achieve a compact and thin-bezel display device.

Figure 11:
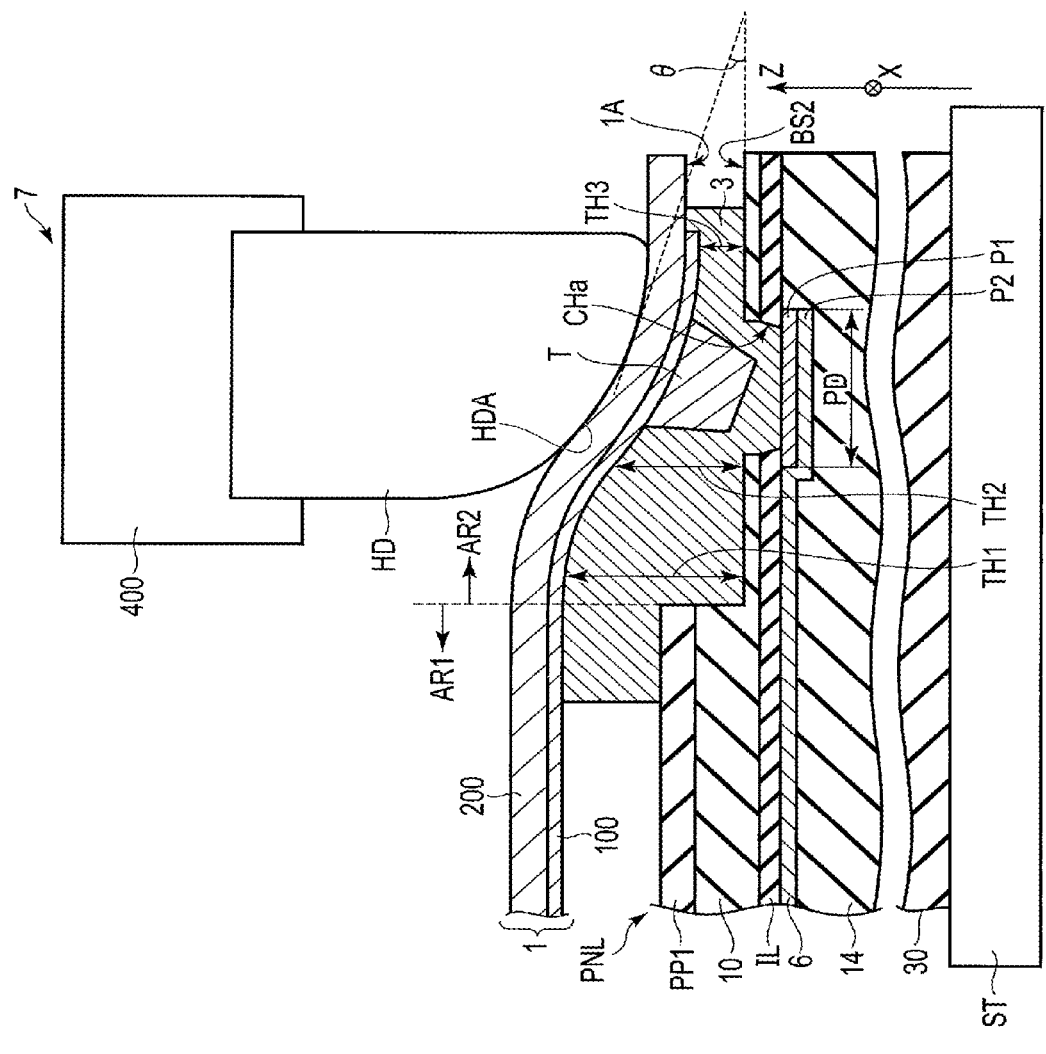
FIG. 11 is a cross-sectional view showing a variation of a press head of the first embodiment.

FIG. 11 is a cross-sectional view showing a variation of the press head HD of the first embodiment. In the example of FIG. 11, the shape of the press head HD is different from that of FIG. 10. In the example of FIG. 11, the press head HD has a surface HDA which is curved.

As in FIG. 10, the moving mechanism 400 moves the press head HD vertically with respect to the second lower surface BS2 of the second area AR2 and presses the press head HD to the line substrate 1. At that time, the surface HDA of the press head HD is inclined with respect to the second lower surface BS2. That is, the surface HDA and the second lower surface BS2 form an acute angle θ. Therefore, the same relationship of the first film thickness TH1, second film thickness TH2, and third film thickness TH3 as aforementioned can be achieved in this variation.

The same advantages can be achieved in this variation.

Figure 12:
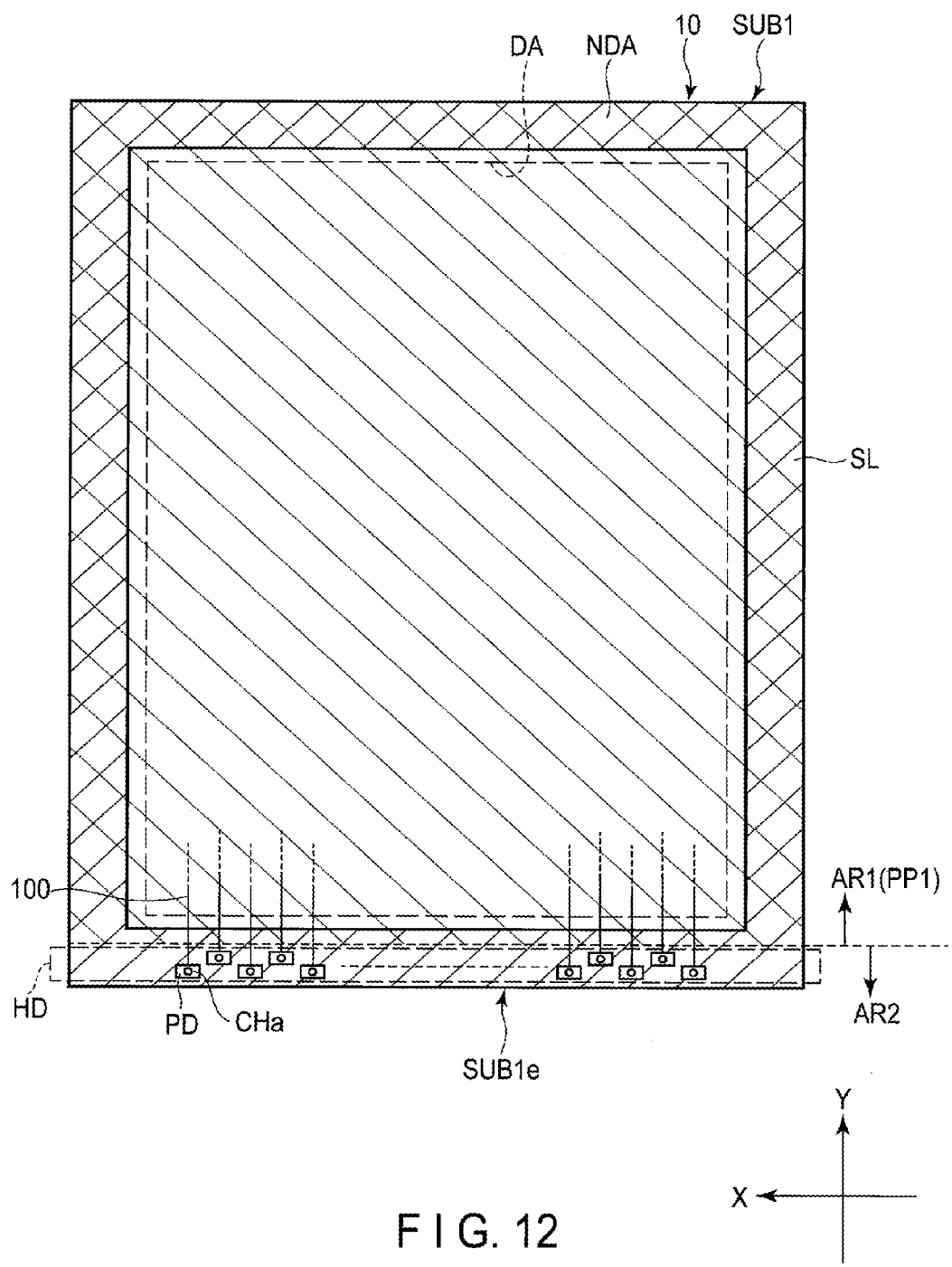
FIG. 12 is a plan view of the first substrate of the first embodiment, in which positions of the contact hole and the press head are depicted.

FIG. 12 is a plan view of the first substrate SUB1 of the first embodiment, in which positions of the contact hole CHa and the press head HD are depicted. In FIG. 5, the area where the sealant SL is formed is hatched up to right.

The first insulating substrate 10 is disposed over the entirety of the first substrate SUB1. The first area AR1 is, in a plan view, an area where the first protection member PP1 is disposed to overlap the first insulating substrate 10. The second area AR2 is, in a plan view, an area where the first protection member PP1 does not overlap the first insulating substrate 10. Furthermore, as aforementioned, the thickness W2 of the second area AR2 is less than the thickness W1 of the first area AR1.

In FIG. 12, the first area AR1 is hatched up to left. The first protection member PP1 is disposed to overlap the entirety of the first area AR1. The second area AR2 is adjacent to the first area AR1 and extends in the first direction X in the non-display area NDA in one end SUB1e side of the first substrate SUB1. A plurality of pad electrodes PD and contact holes CHa overlap the second area AR2 in a plan view. That is, the pad electrode PD and the contact hole CHa are disposed to overlap the thinner area of the first insulating substrate 10. Furthermore, the contact holes CHa are formed in a position overlapping the sealant SL in a plan view.

In the example depicted, the pad electrode PD and the contact hole CHa are arranged in a staggered manner. With the pad electrode PD and the contact hole CHa arranged in such a manner, the connection line 100 and the like can be disposed much densely in the first direction X.

The press head HD is formed to extend in the first direction X. The press head HD is, for example, formed smaller than the width of the second area AR2 in the second direction Y. The press head HD overlaps all the contact holes CHa arranged in a staggered manner. Therefore, the press head HD can press and fix the line substrate and the display panel through a single process. Furthermore, for example, the pad electrode PD and the contact hole CHa may be arranged linearly along the first direction X. In that case, the press head HD can press and fix the line substrate and the display panel through a single process.

Now, the structure of a non-display area NDA of a display device DSP of the second embodiment will be explained.

Figure 13:
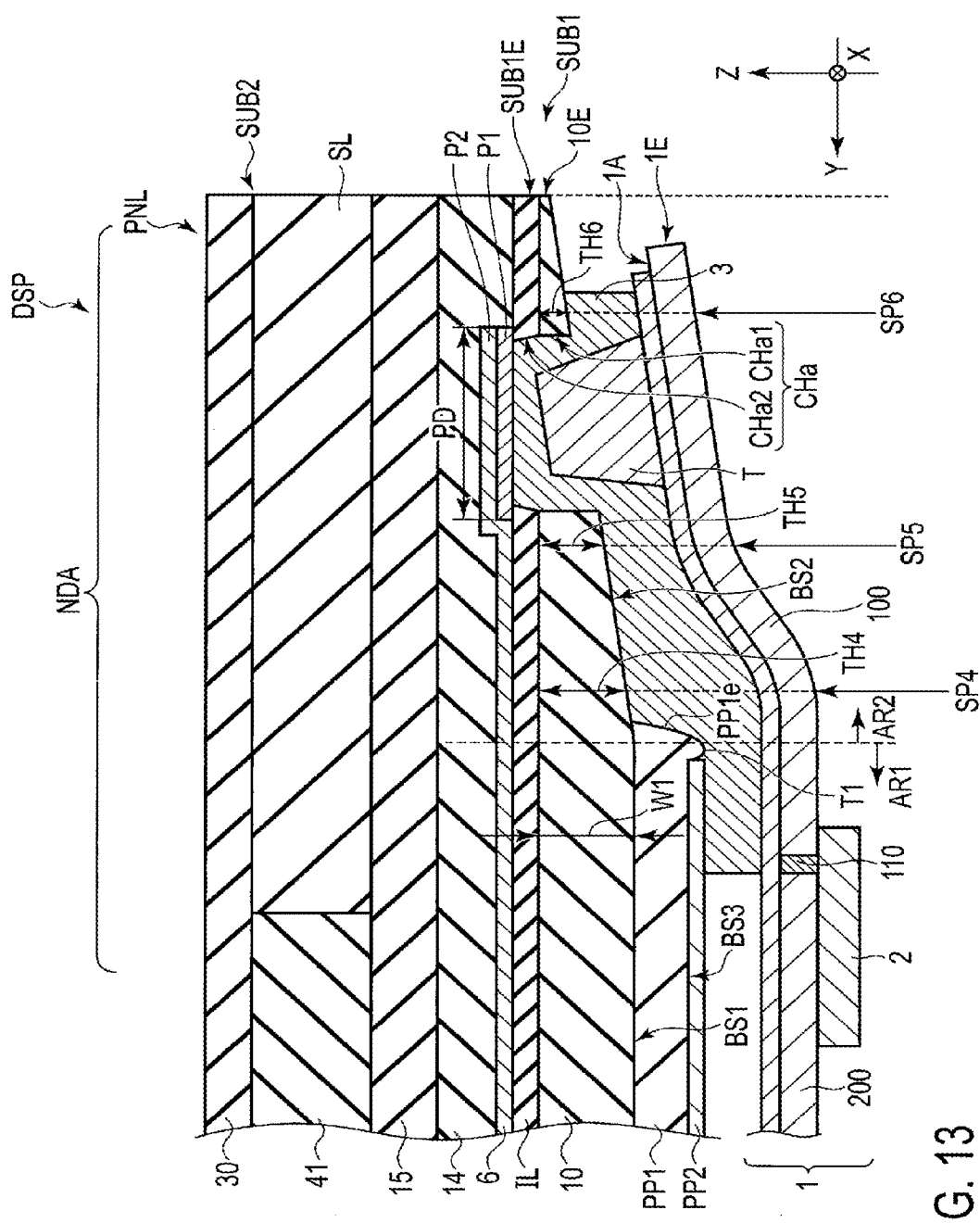
FIG. 13 is a cross-sectional view of a display device of a second embodiment including a non-display area.

FIG. 13 is a cross-sectional view of the display device of the second embodiment including a non-display area. As compared to the first embodiment shown in FIG. 3, mainly, the shape of the first insulating substrate 10 in the second area AR2 and the shape of the first protection member PP1 in the proximity of the end surface PP1e are different in the second embodiment of FIG. 13. Furthermore, as compared to the display device DSP of FIG. 3, the display device DSP of FIG. 13 has a protection member PP2 disposed below the first protection member PP1.

The first lower substrate BS1 contacts the first protection member PP1 and the second lower surface BS2 contacts the anisotropy conductive film 3. Furthermore, the first lower surface BS1 is parallel to the X-Y plane and the second lower surface BS2 is inclined with respect to the X-Y plane. That is, the second lower surface BS2 is inclined with respect to the first lower surface BS1. Thus, the thickness of the first insulating substrate 10 differs in some positions in the second area AR2. The first insulating substrate 10 has a fourth film thickness TH4 in a fourth position SP4 adjacent to the first area AR1, fifth film thickness TH5 in a fifth position SP5 which is closer to the contact hole CHa than is the fourth position SP4, and sixth film thickness TH6 in a sixth position SP6 which is closer to the substrate end 10E than is the contact hole CHa. The fourth film thickness TH4 is greater than the fifth film thickness TH5. Furthermore, in the example depicted, the fifth film thickness TH5 is greater than the sixth film thickness TH6. The size relationship of the fourth film thickness TH4, fifth film thickness TH5, and sixth film thickness TH6 is the same in the first direction X.

In the example of FIG. 13, the second lower surface BS2 is flat from the fourth position SP4 to the fifth position SP5. Furthermore, second lower surface BS2 is flat from the sixth position SP6 to the substrate end 10E. Note that second lower surface BS2 may be curved from the fourth position SP4 to the fifth position SP5. Furthermore, the second lower surface BS2 may be curved from the sixth position SP6 to the substrate end 10E.

Furthermore, in the present embodiment, the sixth film thickness TH6 is approximately 1 µm. The substrate end 10E is formed to a position overlapping the substrate end SUB1E in the third direction Z; however, the substrate end 10E may be disposed inside the substrate end SUB1E. That is, for example, the first insulating substrate 10 may not be formed in an area from the sixth position SP6 to the substrate end SUB1E.

The first protection member PP1 includes an end surface PP1e, third lower surface BS3 contacting the protection member PP2, and projection T1 contacting the anisotropy conductive film 3. In the example of FIG. 13, the end surface PP1e contacts the anisotropy conductive film 3. The end surface PP1e is inclined with respect to the X-Z plane which is defined by the first direction X and the third direction Z. The end surface PP1e is inclined to face the line substrate 1 side. In the example depicted, the end surface PP1e is flat; however, it may be curved. The projection T1 projects in the line substrate 1 side than does the third lower surface BS3.

The protection member PP2 is disposed below the first protection member PP1. The protection member PP2 is, for example, a metal layer deposited on the first protection member. Here, the protection member PP2 is formed of, for example, aluminum or an aluminum alloy.

Now, a manufacturing process of the display device of the second embodiment will be explained with reference to FIGS. 14 to 19. In FIGS. 14 to 19, processes after the process of peeling the support substrate 5 from the first insulating substrate 10 of FIG. 5.

FIG. 14 is a cross-sectional view showing a process in which the first protection member PP1 and the protection member PP2 are adhered to the first insulating substrate 10. FIG. 15 is a plan view showing a distribution of the density of the protection member PP2 of FIG. 14.

Initially, before the first protection member PP1 is adhered to the first insulating substrate 10, the protection member PP2 is formed on the surface B of the first protection member PP1. The protection member PP2 is formed of, for example, a metal material through deposition on the surface B of the first protection member PP1. In the present embodiment, for example, the first protection member PP1 is formed of polyethylene terephthalate and the protection member PP2 is formed of aluminum.

Then, the first protection member PP1 integrated with the protection member PP2 is adhered to the first insulating substrate 10 by an adhesive sheet. Specifically, while the adhesive sheet is disposed between the first insulating substrate 10 and the first protection member PP1, alignment of the first protection member PP1 is performed, and a heat treatment is performed to make the adhesive sheet adhesive to adhere the first protection member PP1 to the bottom of the first insulating substrate. Thereby, a misalignment of the first protection member PP1 can be suppressed.

Here, the second protection member PP2 has a thickness in the third direction Z of, for example, approximately 30 to 500 nm, and preferably, 50 nm or more. The protection member PP2 is formed 30 nm or more in thickness sufficient to protect the first protection member PP1. With greater thickness, the effect of protecting the first protection member PP1 is improved. However, when the thickness of the protection member PP2 becomes greater, the time required for its deposition becomes longer, and the production needs a longer period and the productivity becomes less. To avoid these matters, the protection member PP2 is, preferably, formed 500 nm or less in thickness.

The protection member PP2 includes a cut CU on the boundary surface HD between the first area AR1 and the second area AR2. The cut CU extends in the first direction X. For example, the protection member PP2 is formed by filling a metal material in dots. Here, the density of the dots can be changed in some positions of the protection member PP2. As shown in FIG. 15, the protection member PP2 has different densities in the first area AR1 and the second area AR2. For example, the protection member PP2 is distributed substantially even in the first area AR1 while it is distributed to be less toward the substrate end SUB1E side from the boundary surface BD in the second area AR2. That is, when the laser is irradiated from below the protection member PP2, the protection member PP2 rarely pass the light in the first area AR1 and passes the light easier toward the substrate end SUB1E in the second area AR.

Figure 16:
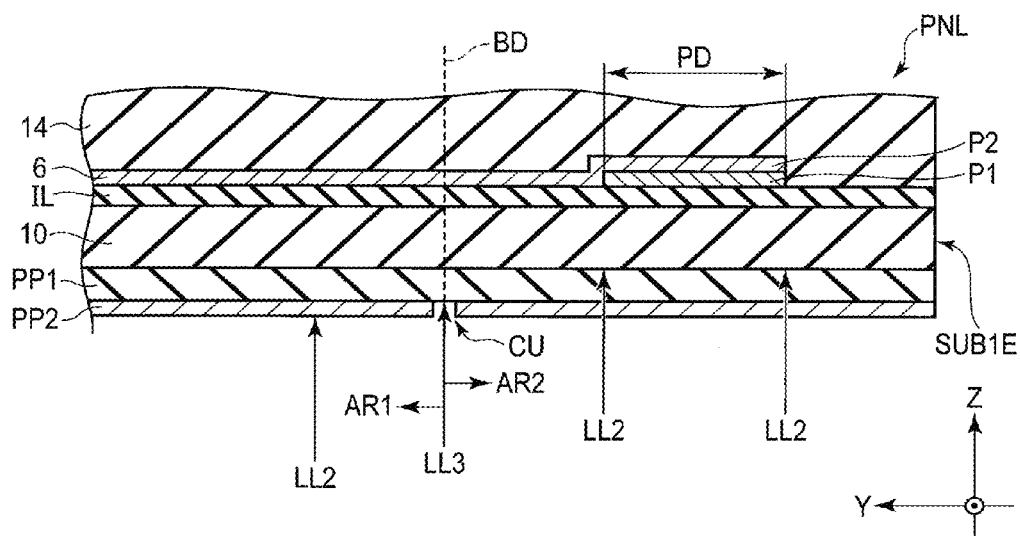
FIG. 16 is a cross-sectional view showing a process in which the protection members disposed to overlap the second area are peeled off.

FIG. 16 is a cross-sectional view showing a process in which the first protection member PP1 and the protection member PP2 disposed to overlap the second area AR2 are peeled off.

Then, laser LL2 is irradiated from below the second protection member PP2 to peel the first protection member PP1 and the second protection member PP2 from the first insulating substrate 10. The laser LL2 is the same laser as the laser LL1 in FIG. 5, for example. The amount of the first insulating substrate 10 trimmed by the laser increases when the power of the laser LL2 becomes stronger. As described above, the second protection member PP2 does not pass the laser LL2 in the first area AR1 and passes the laser LL2 greater toward the substrate end SUB1E from the boundary surface BD in the second area AR2. That is, the laser LL2 reaches the first insulating substrate 10 in the second area AR2 and the first insulating substrate 10 is decomposed to the extent defined by the power of the laser LL2 reaching. Thereby, a space is created at the interface between the first protection member PP1 and the first insulating substrate 10, and the second lower surface BS2 of the second area AR2 is formed to be inclined with respect to the X-Y plane. Then, laser LL3 is irradiated to a position overlapping the cut CU, the first protection member PP1 is cut and the first protection member PP1 and the protection member PP2 are peeled off from the first insulating substrate 10 in the position overlapping the second area AR2. Note that the laser LL3 is different from the laser LL1 and the laser LL2. The laser LL3 is, for example, UV laser or CO2 laser.

Figure 17:
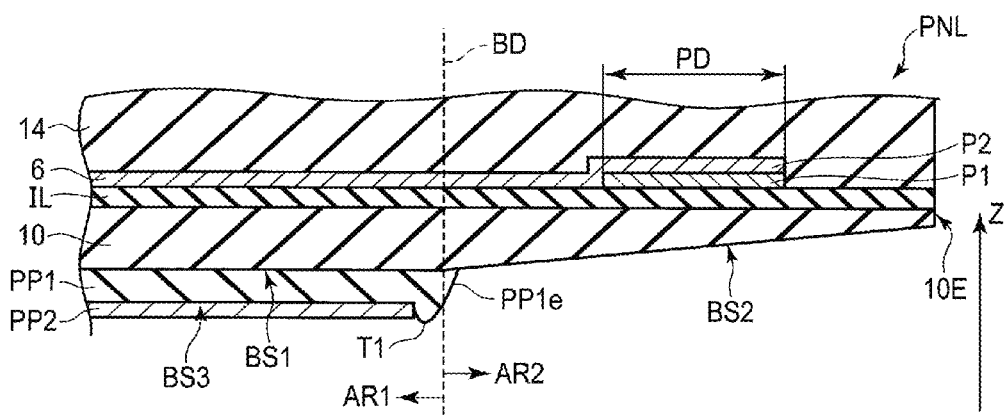
FIG. 17 is a cross-sectional view showing a state of the display panel after the peeling process of the protection members disposed in the position overlapping the second area.

FIG. 17 is a cross-sectional view showing a state of the display panel PNL after the peeling process of the first protection member PP1 and the protection member PP2 disposed in the position overlapping the second area AR2.

The first lower surface BS1 is inclined with respect to the second lower surface BS2. That is, the first insulating substrate 10 has a thickness in the second area AR2 in the third direction Z which decreases toward the substrate end 10E from the boundary surface BD. Furthermore, the end surface PP1e is formed in a curved shape since the cut surface of the first protection member PP1 is melt by the heat of the laser LL3 in the cutting process of the first protection member PP1 in the process of FIG. 16. Furthermore, the projection T1 projecting lower than is the third lower surface BS3 is formed in the first protection member PP1.

FIG. 18 is a cross-sectional view showing a process in which a first contact hole CHa1 is formed in the first insulating substrate 10.

The laser is irradiated from below the first substrate SUB1 toward the area overlapping the pad electrode PD, and the contact hole CHa reaching the pad electrode PD is formed in the second area AR2 of the first insulating substrate 10. Note that, in the example of FIG. 8, the contact hole CHa2 is formed in the insulating film IL by the ashing process; however, in the example of FIG. 18, both the first contact hole CHa1 and the second contact hole CHa2 may be formed by the laser by, for example, increasing the number of the laser irradiation processes and the rigidity of the first insulating substrate 10. At that time, the second area AR2 of the first insulating substrate 10 is not thinned as compared to the case of FIG. 8. Note that the contact hole CHa2 is formed by trimming the insulating film IL inside the first contact hole CHla by an ashing process.

Figure 19:
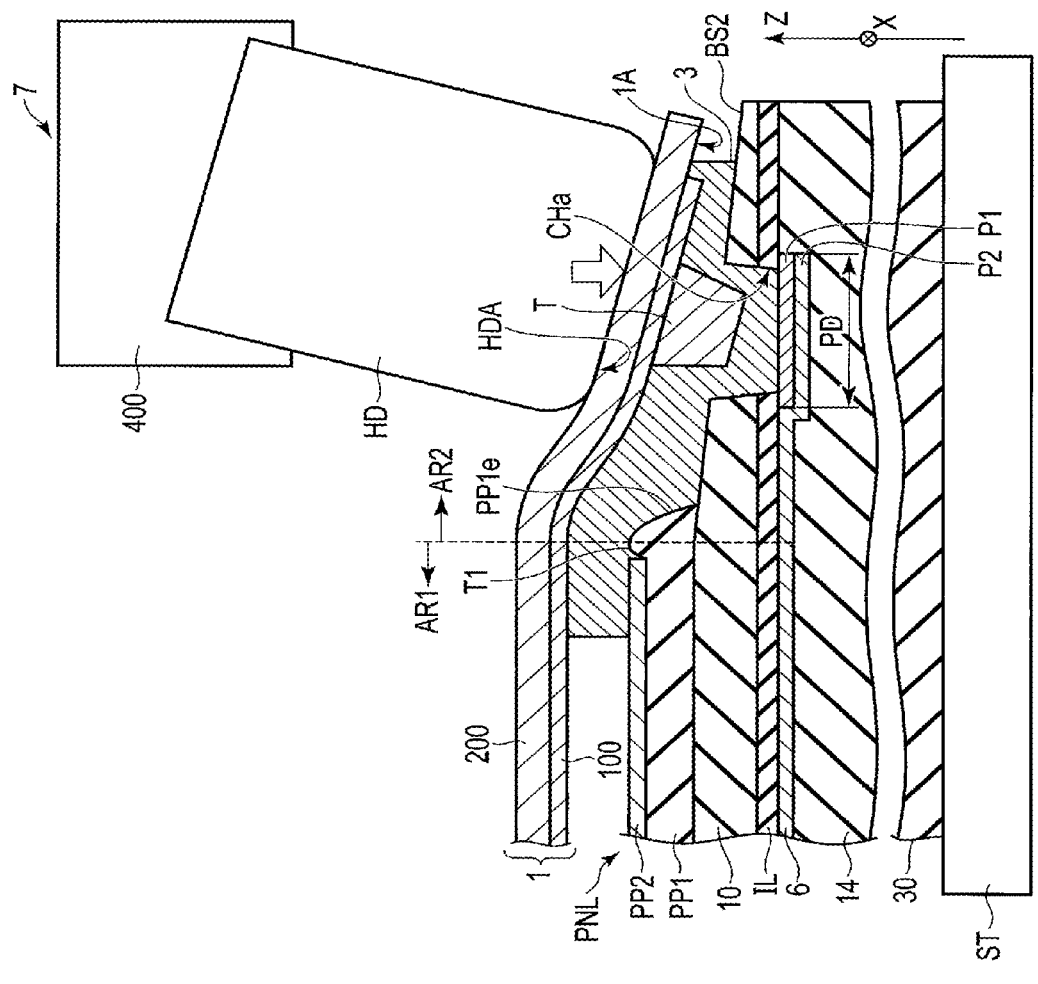
FIG. 19 is a cross-sectional view showing a process in which the line substrate is pressed to the display panel.

FIG. 19 is a cross-sectional view showing a process in which the line substrate 1 is pressed to the display panel PNL.

As in the processes shown in FIGS. 9 and 10, after the display panel PNL, anisotropy conductive film 3, and line substrate 1 are mounted on the stage ST, the moving mechanism 400 moves the press head HD toward the line substrate 1 and presses the press head HD to the display panel PNL from above the line substrate 1. Here, since the second lower surface BS2 is inclined, the anisotropy conductive film 3 easily flows from the space between the second area AR2 and the line substrate 1 to the space between the first area AR1 and the line substrate 1. The anisotropy conductive film 3 covers the end surface PP1e, protection T1, first protection member PP1, and the protection member PP2. Note that, in the second embodiment, the press head HD may be formed such that the surface HDA is curved as in FIG. 11.

Through the above processes, the line substrate 1 is pressed and fixed to the display panel PNL.

In the second embodiment, the second lower surface BS2 is inclined with respect to the first lower surface BS1. Furthermore, the end surface PP1e is inclined to face the line substrate 1. Therefore, the anisotropy conductive film 3 spreads more from the space between the second area AR2 and the line substrate 1 to the space between the first area AR1 and the line substrate 1. As in the first embodiment, the end surface PP1e is covered with the anisotropy conductive film 3, the adherence and barrier property of the end surface PP1e can be improved. Furthermore, increase in curvature of the line substrate 1 caused by a height difference in the end surface PP1e can be suppressed. Therefore, a possible breakdown of lines in the line substrate 1 such as connection line 100 and the like can be avoided, and the productivity can be improved.

FIG. 20 is a cross-sectional view showing a variation of the protection member PP2 of FIG. 14. In FIG. 20, the protection member PP2 has a different shape in the second area AR2 as compared to the case of FIG. 14.

In the example of FIG. 15, the protection member PP2 has, in the third direction Z, substantially the same thickness in the first area AR1 and has a thickness decreasing toward the substrate end SUB1E from the boundary surface BD in the second area AR2. That is, when the laser is irradiated from below the protection member PP2, the protection member PP2 rarely pass the light in the first area AR1 and passes the light easier toward the substrate end 10E in the second area AR.

With the above protection member PP2, the second lower surface BS2 with the inclined first insulating substrate 10 as in FIG. 17 can be formed.

Figure 21:
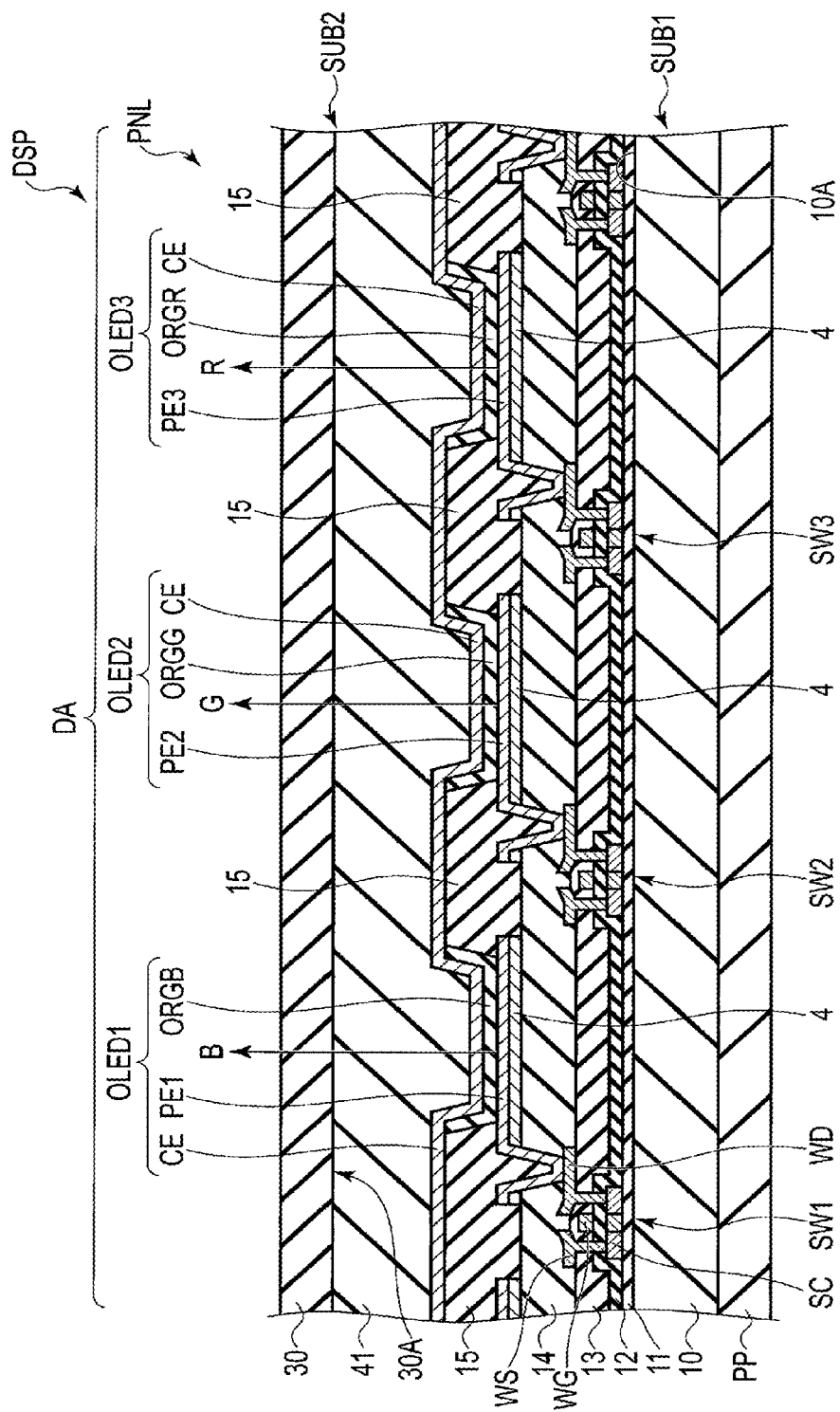
FIG. 21 is a cross-sectional view showing a variation of the display device of FIG. 2.

FIG. 21 is a cross-sectional view showing a variation of the display device DSP of FIG. 2. The display device DSP of FIG. 21 does not include a color filter layer 220, and in this respect, the display device DSP of FIG. 21 is different from that of FIG. 2.

Here, for example, the organic EL element OLED1 includes an organic light emitting layer ORGB which emits blue light, organic EL element OLED2 includes an organic light emitting layer ORGG which emits green light, and organic EL element OLED3 includes an organic emitting layer ORGR which emits red light. The organic EL elements OLED1 to OLED3 are of top-emission type which emits red, blue, and green light toward the second substrate SUB2.

The organic light emitting layer ORGB is positioned above the positive electrode PE1, organic light emitting layer ORGG is positioned above the positive electrode PE2, and organic light emitting layer ORGR is positioned above the positive electrode PE3. The common electrode CE is positioned above the organic light emitting layers ORGB, ORGG, and ORGR. The common electrode CE is positioned above the ribs 15.

In such a display device DSP, when the organic EL elements OLED1 to OLED3 emit light, the organic EL element OLED1 emits blue light, organic EL element OLED2 emits green light, and organic EL element OLED1 emits red light. Thus, even if there is no color filter layer in the display device DSP, the color display can be achieved.

As can be understood from the above, the present embodiments can achieve a compact and thin-bezel display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above insulating film IL includes the first insulating film 11, second insulating film 12, and third insulating film 13; however, no limitation is intended thereby. Various changes can be applied thereto. For example, the insulating film IL may be a monolayer insulating film, or may be a double-layered insulating film, or may be an insulating film including four or more layers.

The above embodiment may be applied to a liquid crystal display device instead of an organic electroluminescent display device. In that case, the display panel PNL is, for example, a liquid crystal display panel including a liquid crystal layer interposed between the first substrate SUB1 and the second substrate SUB2. A liquid crystal display panel as the display panel PNL may be of reflective type which selectively reflects light incident from the second substrate SUB2 side of may be of transmissive type which selectively transmits light incident from the second substrate SUB2 side. Note that, in a plan view, if the display area DA and the line substrate 1 overlap each other, the reflective type is suitable; however, the reflective type may be adopted when a backlight unit can be dispose between the first substrate SUB1 and the line substrate 1. Note that the main structure of the present embodiment is substantially the same even if the display device DSP is a liquid crystal display device.

What is claimed is:

1. A display device comprising:
a first flexible substrate including an insulating substrate including a first area, a second area adjacent to the first area, and a through hole formed in the second area, and a pad electrode disposed above the through hole;
a second flexible substrate including a connection line disposed to be opposed to the through hole, the second flexible substrate disposed below the first flexible substrate; and
an anisotropy conductive film which electrically connects the pad electrode and the connection line; wherein
the anisotropy conductive film is disposed between the second area and the second flexible substrate, and has a first film thickness in a first position which is adjacent to the first area and a second film thickness in a second position which is closer to the through hole than is the first position, where the first film thickness is greater than the second film thickness.

2. The display device of claim 1, wherein the second area is thinner than the first area.

3. The display device of claim 2, wherein the anisotropy conductive film is disposed between the first area and the second flexible substrate and covers a surface between the first area and the second area.

4. The display device of claim 1, wherein the insulating substrate has a first lower surface in the first area and a second lower surface in the second area, and
the anisotropy conductive film is apart from the first lower surface and contacts the second lower surface.

5. The display device of claim 4, wherein the second flexible substrate is inclined with respect to the second lower surface and has a flat surface or a curved surface from the first position to the second position.

6. The display device of claim 1, wherein the connection line is inclined with respect to the pad electrode.

7. The display device of claim 1, further comprising a protection member disposed below the first flexible substrate.

8. The display device of claim 7, wherein the insulating substrate includes a first lower surface in the first area and a second lower surface in the second area, and
the protection member contacts the first lower surface.

9. The display device of claim 1, wherein an end of the second flexible substrate is positioned below the second area.

10. A display device comprising:
a first flexible substrate including an insulating substrate including a first area, a second area adjacent to the first area, and a through hole formed in the second area, and a pad electrode disposed above the through hole;
a second flexible substrate including a connection line disposed to be opposed to the through hole, the second flexible substrate disposed below the first flexible substrate; and
an anisotropy conductive film which electrically connects the pad electrode and the connection line, wherein
the second area has a fourth film thickness in a fourth position which is adjacent to the first area and a fifth film thickness in a fifth position which is closer to the through hole than is the fourth position, where the fourth film thickness is greater than the fifth film thickness.

11. The display device of claim 10, wherein the insulating substrate includes a first lower surface in the first area and a second lower surface in the second area, and
the second lower surface is inclined with respect to the first lower surface.

12. The display device of claim 11, further comprising a first protection member disposed below the first flexible substrate and contacting the first lower surface and a second protection member disposed below the first protection member, wherein
the second lower surface contacts the anisotropy conductive film.

13. The display device of claim 12, wherein the first protection member has a first end surface which is inclined and contacts the anisotropy conductive film.

14. The display device of claim 13, wherein the first end surface is curved.

15. The display device of claim 12, wherein the second protection member is formed of aluminum or an aluminum alloy.

16. The display device of claim 12, wherein the first protection member includes a third lower surface contacting the second protection member and a projection contacting the anisotropy conductive film and projecting in the second flexible substrate side than does the third lower surface.

17. The display device of claim 1, further comprising a counter substrate opposed to the first flexible substrate and disposed above the first flexible substrate, and
- an adhesive layer which adheres the first flexible substrate and the counter substrate, wherein
- the through hole is formed in a position overlapping the adhesive layer.

\* \* \* \* \*